United States Patent
Essafi et al.

(10) Patent No.: US 11,562,659 B2
(45) Date of Patent: Jan. 24, 2023

(54) SYSTEMS AND METHODS FOR INSTRUMENTATION OF EDUCATION PROCESSES

(71) Applicant: EDUCATION4SIGHT GmbH, Erlangen (DE)

(72) Inventors: Lassaad Essafi, Wettstetten (DE); Zouhair Essafi, Dubai (AE); Pekka Kekolahti, Veikkola (FI)

(73) Assignee: EDUCATION4SIGHT GmbH, Erlangen (DE)

( * ) Notice: Subject to any disclaimer, the term of this patent is extended or adjusted under 35 U.S.C. 154(b) by 50 days.

(21) Appl. No.: 16/709,396

(22) Filed: Dec. 10, 2019

(65) Prior Publication Data

US 2020/0118453 A1    Apr. 16, 2020

Related U.S. Application Data

(63) Continuation of application No. 15/344,493, filed on Nov. 4, 2016, now Pat. No. 10,515,562.

(Continued)

(51) Int. Cl.
*G09B 7/00* (2006.01)
*G06Q 10/00* (2012.01)
(Continued)

(52) U.S. Cl.
CPC .............. *G09B 7/00* (2013.01); *G06F 30/20* (2020.01); *G06N 3/08* (2013.01); *G06Q 10/00* (2013.01);
(Continued)

(58) Field of Classification Search
CPC .... G09B 17/003; G09B 19/00; G09B 19/025; G09B 19/06; G09B 7/00; G06F 30/20; G06N 3/08; G06Q 10/00
See application file for complete search history.

(56) References Cited

U.S. PATENT DOCUMENTS 6,029,159 A * 2/2000 Zorba ................. G06Q 20/102
434/118
10,290,221 B2    5/2019 Stacy et al.
(Continued)

OTHER PUBLICATIONS

International Preliminary Report on Patentability re PCT/IB2016/001673 dated May 8, 2018.
(Continued)

*Primary Examiner* — Eddy Saint-Vil
(74) *Attorney, Agent, or Firm* — Foley & Lardner LLP

(57) ABSTRACT

Systems and methods for education instrumentation can include one or more servers configured generate a plurality of models for modeling various aspects of an education process using training data related to academic performance of students. The one or more servers can collect data from client devices associated with various education institutions or stakeholders throughout a life cycle of the education process. The one or more servers can use the generated models and the collected data to assess the addressing of education standards and predict or estimate performance metrics associated with the education process. The one or more servers can provide computed metrics or assessments of how well education standards are addressed to one or more client devices for display.

20 Claims, 22 Drawing Sheets

Related U.S. Application Data

(60) Provisional application No. 62/250,933, filed on Nov. 4, 2015.

(51) Int. Cl.
*G09B 19/02* (2006.01)
*G09B 19/00* (2006.01)
*G09B 17/00* (2006.01)
*G09B 19/06* (2006.01)
*G06N 3/08* (2006.01)
*G06F 30/20* (2020.01)

(52) U.S. Cl.
CPC ........... *G09B 17/003* (2013.01); *G09B 19/00* (2013.01); *G09B 19/025* (2013.01); *G09B 19/06* (2013.01)

(56) References Cited

U.S. PATENT DOCUMENTS

| | | | |
|---|---|---|---|
| 2002/0042786 A1* | 4/2002 | Scarborough | G06Q 10/10 706/21 |
| 2002/0052859 A1* | 5/2002 | Rosenfeld | G09B 7/04 706/47 |
| 2002/0138590 A1* | 9/2002 | Beams | G09B 7/00 709/218 |
| 2006/0147890 A1* | 7/2006 | Bradford | G09B 7/00 434/362 |
| 2009/0035733 A1* | 2/2009 | Meitar | G09B 7/00 434/118 |
| 2009/0202969 A1* | 8/2009 | Beauchamp | G06N 5/02 434/335 |
| 2010/0009331 A1* | 1/2010 | Yaskin | G09B 7/00 434/362 |
| 2010/0057644 A1* | 3/2010 | Barton | G09B 5/00 706/11 |
| 2010/0190142 A1* | 7/2010 | Gal | G09B 5/00 434/322 |
| 2012/0310961 A1 | 12/2012 | Callison et al. | |
| 2013/0096892 A1* | 4/2013 | Essa | G06F 17/18 703/2 |
| 2013/0226460 A1 | 8/2013 | Wu | |
| 2013/0246317 A1 | 9/2013 | Martin | |
| 2013/0330704 A1* | 12/2013 | Creamer | G09B 7/00 434/362 |
| 2016/0035230 A1 | 2/2016 | Spaulding | |

OTHER PUBLICATIONS

International Search Report and Written Opinion for PCT/IB2016/001673 dated Feb. 1, 2017.

Non-Final Office Action on U.S. Appl. No. 15/344,493 dated Nov. 16, 2018.

Non-Final Office Action on U.S. Appl. No. 16/708,959 dated Sep. 20, 2021.

Non-Final Office Action on U.S. Appl. No. 16/711,245 dated Aug. 19, 2021.

Notice of Allowance on U.S. Appl. No. 15/344,493 dated Jul. 29, 2019.

ProvasniK et al., U.S. Performance Across International Assessments or Student Achievement, retrieved from the internet athttps://nces.ed.gov/pubs2009/2009083.pdf (Year: 2009).

Yuan et al., Measuring Deeper Learning Through Cognitively Demanding Test Items_ Results from the Analysis of Six National and International Exams, retrieved from the internet at https://www.rand.org/content/dam/rand/pubs/research_reports/RR400/RR483/RAND_RR483.pdf (Year: 2014).

\* cited by examiner

SYSTEMS AND METHODS FOR INSTRUMENTATION OF EDUCATION PROCESSES

CROSS REFERENCE TO RELATED APPLICATIONS

This application is a continuation of U.S. patent application Ser. No. 15/344,493 filed on Nov. 4, 2019, which claims the benefit under 35 U.S.C. § 119(e) of U.S. Provisional Application No. 62/250,933, entitled "SYSTEMS AND METHODS FOR MODELING EDUCATION DATA AND PREDICTING ACADEMIC PERFORMANCE" and filed Nov. 4, 2015, both of these applications are incorporated herein by reference in their entirety.

FIELD OF THE DISCLOSURE

The present application relates generally to systems and methods for the instrumentation of the education process. Specifically, the present application relates to computerized methods and systems for determining the relative importance of, and the dependency relationships between, various factors that influence education processes, and predicting learning outcome.

BACKGROUND

Most countries aspire and struggle to improve and fix their education systems and so do many districts and schools. In the effort for continuous improvement in education, schools, school districts, colleges, universities, professional development institutes, departments of education, organizations or private sector companies may conduct various types of analyses that may be qualitative or quantitative in nature. Such analyses are usually based on academic assessment scores.

SUMMARY

According to one aspect, a system for computing performance metrics of education processes the system can include one or more computer servers and one or more client applications running on a plurality of client devices. The one or more client applications can provide a plurality of user interfaces associated with a plurality of stages of a life cycle of an education process. The one or more servers having a database, a data collector, an analysis module, a simulator, and an output module. The database can store training data and test data related to student academic performance of a first plurality of students. The data collector can receive student information data for a second plurality of students from a student information system (SIS). The data collector can receive, from one or more client devices, one or more sets of standard elements for one or more lesson plans selected via a first user interface associated with the one or more client devices. The first user interface can include lesson planning templates for selection of standard elements for lesson planning. The analysis module can generate, using the training data, a plurality of models to simulate performance of an education process, and validate the plurality of models using the test data. The simulator can select a model from the plurality of models based on a selection by a client device of a student population among the second plurality of students. The simulator can compute a performance metric using the selected model and at least a subset of the student information data and the one or more sets of standard elements. The output module can provide the computed performance metric for display on the plurality of client devices via a second user interface of the plurality of user interfaces.

According to one other aspect, a method for computing performance metrics of education processes can include storing, by one or more processors, training data and test data in a database. The training data and the test data can be related to student academic performance of a first plurality of students. The one or more processors can receive student information data for a second plurality of students from a student information system (SIS), and receive, from one or more client devices, one or more sets of standard elements for one or more lesson plans selected via a first user interface associated with the one or more client devices. The first user interface including lesson planning templates for selection of standard elements for lesson planning. The one or more processors can generate, using the training data, a plurality of models to simulate performance of an education process, and validate the plurality of models using the test data. The one or more processors can select a model from the plurality of models based on a selection by a client device of a student population among the second plurality of students. The one or more processors can compute a performance metric using the selected model and at least a subset of the student information data and the one or more sets of standard elements. The one or more processors can provide the computed performance metric for display on the client device via a second user interface of the plurality of user interfaces.

According to another aspect, a computer-readable medium can include computer code instructions stored thereon, which when executed by one or more processors of a first device, cause the one or more processors to store training data and test data in a database. The training data and the test data can be related to student academic performance of a first plurality of students. The one or more processors can receive student information data for a second plurality of students from a student information system (SIS), and receive, from one or more client devices, one or more sets of standard elements for one or more lesson plans selected via a first user interface associated with the one or more client devices. The first user interface including lesson planning templates for selection of standard elements for lesson planning. The one or more processors can generate, using the raining data, a plurality of models to simulate performance of an education process, and validate the plurality of models using the test data. The one or more processors can select a model from the plurality of models based on a selection by a client device of a student population among the second plurality of students. The one or more processors can compute a performance metric using the selected model and at least a subset of the student information data and the one or more sets of standard elements. The one or more processors can provide the computed performance metric for display on the client device via a second user interface of the plurality of user interfaces.

BRIEF DESCRIPTION OF THE DRAWINGS

FIGS. 8A-E show various UIs associated with a curriculum planning stage of the life cycle shown in FIG. 7.

FIG. 9 shows a UI associated with the instruction stage of the life cycle in FIG. 7.

DETAILED DESCRIPTION

For purposes of reading the description of the various embodiments below, the following descriptions of the sections of the specification and their respective contents may be helpful:

Section A describes a computing and network environment which may be useful for practicing embodiments described herein.

Section B describes a computer environment for instrumentation of education processes.

A. Computing and Network Environment

Figure 1A:
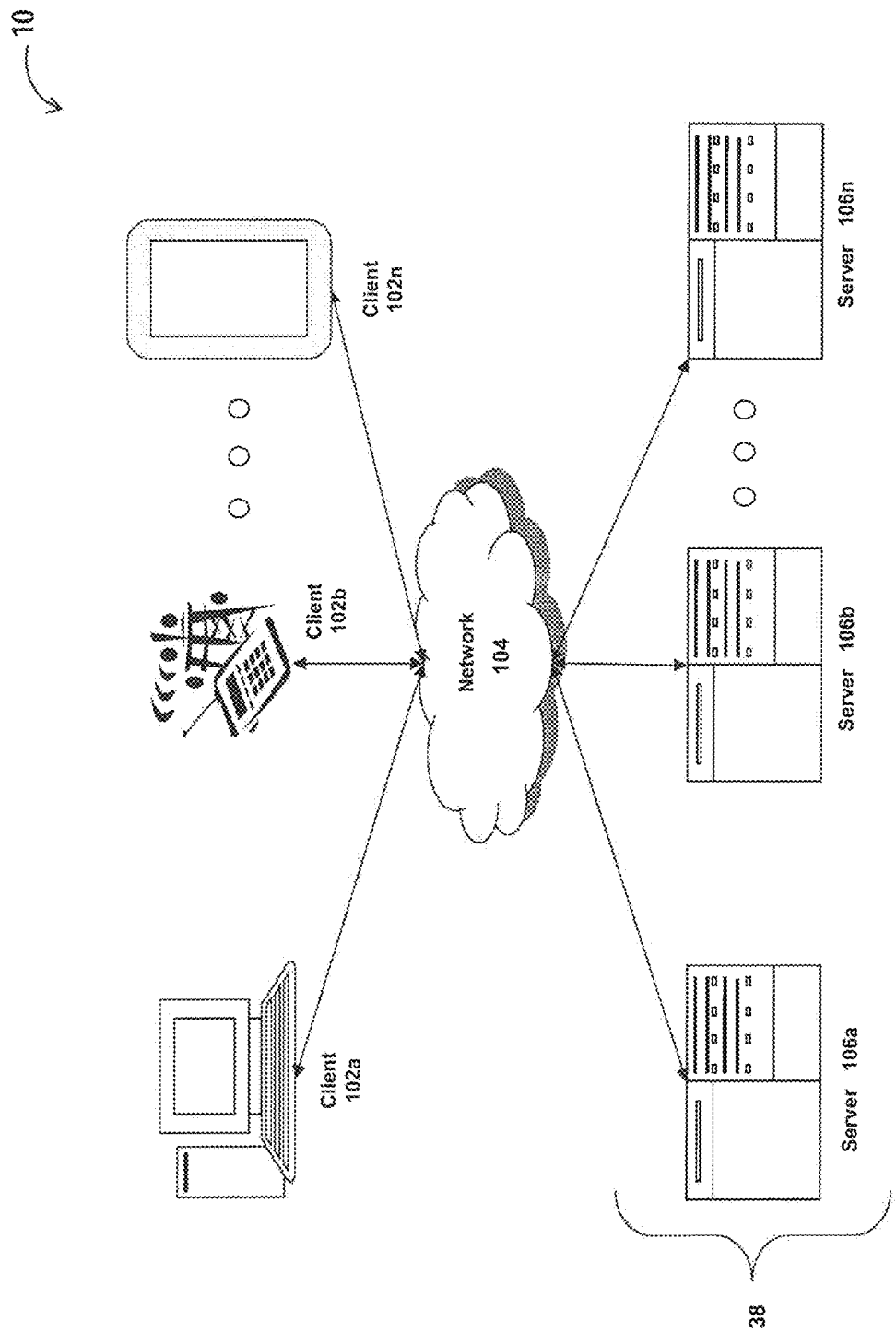
FIG. 1A is a block diagram depicting an embodiment of a network environment comprising local devices in communication with remote devices.

In addition to discussing specific embodiments of the present solution, it may be helpful to describe aspects of the operating environment as well as associated system components (e.g., hardware elements) in connection with the methods and systems described herein. Referring to FIG. 1A, an embodiment of a computing and network environment 10 is depicted. In brief overview, the computing and network environment includes one or more clients 102a-102n (also generally referred to as local machine(s) 102, client(s) 102, client node(s) 102, client machine(s) 102, client computer(s) 102, client device(s) 102, endpoint(s) 102, or endpoint node(s) 102) in communication with one or more servers 106a-106n (also generally referred to as server(s) 106, node 106, or remote machine(s) 106) via one or more networks 104. In some embodiments, a client 102 has the capacity to function as both a client node seeking access to resources provided by a server and as a server providing access to hosted resources for other clients 102a-102n.

Although FIG. 1A shows a network 104 between the clients 102 and the servers 106, the clients 102 and the servers 106 may be on the same network 104. In some embodiments, there are multiple networks 104 between the clients 102 and the servers 106. In one of these embodiments, a network 104' (not shown) may be a private network and a network 104 may be a public network. In another of these embodiments, a network 104 may be a private network and a network 104' a public network. In still another of these embodiments, networks 104 and 104' may both be private networks.

The network 104 may be connected via wired or wireless links. Wired links may include Digital Subscriber Line (DSL), coaxial cable lines, or optical fiber lines. The wireless links may include BLUETOOTH, Wi-Fi, Worldwide Interoperability for Microwave Access (WiMAX), an infrared channel or satellite band. The wireless links may also include any cellular network standards used to communicate among mobile devices, including standards that qualify as 1G, 2G, 3G, or 4G. The network standards may qualify as one or more generation of mobile telecommunication standards by fulfilling a specification or standards such as the specifications maintained by International Telecommunication Union. The 3G standards, for example, may correspond to the International Mobile Telecommunications-2000 (IMT-2000) specification, and the 1G standards may correspond to the International Mobile Telecommunications Advanced (IMT-Advanced) specification. Examples of cellular network standards include AMPS, GSM, GPRS, UMTS, LTE, LTE Advanced, Mobile WiMAX, and WiMAX-Advanced. Cellular network standards may use various channel access methods e.g. FDMA, TDMA, CDMA, or SDMA. In some embodiments, different types of data may be transmitted via different links and standards. In other embodiments, the same types of data may be transmitted via different links and standards.

The network 104 may be any type and/or form of network. The geographical scope of the network 104 may vary widely and the network 104 can be a body area network (BAN), a personal area network (PAN), a local-area network (LAN), e.g. Intranet, a metropolitan area network (MAN), a wide area network (WAN), or the Internet. The topology of the network 104 may be of any form and may include, e.g., any of the following: point-to-point, bus, star, ring, mesh, or tree. The network 104 may be an overlay network which is virtual and sits on top of one or more layers of other networks 104'. The network 104 may be of any such network topology as known to those ordinarily skilled in the art capable of supporting the operations described herein. The network 104 may utilize different techniques and layers or stacks of protocols, including, e.g., the Ethernet protocol, the internet protocol suite (TCP/IP), the ATM (Asynchronous Transfer Mode) technique, the SONET (Synchronous Optical Networking) protocol, or the SDH (Synchronous Digital Hierarchy) protocol. The TCP/IP internet protocol suite may include application layer, transport layer, internet layer (including, e.g., IPv6), or the link layer. The network 104 may be a type of a broadcast network, a telecommunications network, a data communication network, or a computer network.

In some embodiments, the computing and network environment 10 may include multiple, logically-grouped servers 106. In one of these embodiments, the logical group of servers may be referred to as a server farm 38 or a machine farm 38. In another of these embodiments, the servers 106 may be geographically dispersed. In other embodiments, a machine farm 38 may be administered as a single entity. In still other embodiments, the machine farm 38 includes a plurality of machine farms 38. The servers 106 within each machine farm 38 can be heterogeneous—one or more of the servers 106 or machines 106 can operate according to one type of operating system platform (e.g., WINDOWS 8 or 10, manufactured by Microsoft Corp. of Redmond, Wash.), while one or more of the other servers 106 can operate on according to another type of operating system platform (e.g., Unix, Linux, or Mac OS X).

In one embodiment, servers 106 in the machine farm 38 may be stored in high-density rack systems, along with associated storage systems, and located in an enterprise data center. In this embodiment, consolidating the servers 106 in this way may improve system manageability, data security, the physical security of the system, and system performance by locating servers 106 and high performance storage systems on localized high performance networks. Centralizing the servers 106 and storage systems and coupling them with advanced system management tools allows more efficient use of server resources.

The servers 106 of each machine farm 38 do not need to be physically proximate to another server 106 in the same machine farm 38. Thus, the group of servers 106 logically grouped as a machine farm 38 may be interconnected using a wide-area network (WAN) connection or a metropolitan-area network (MAN) connection. For example, a machine farm 38 may include servers 106 physically located in different continents or different regions of a continent, country, state, city, campus, or room. Data transmission speeds between servers 106 in the machine farm 38 can be increased if the servers 106 are connected using a local-area network (LAN) connection or some form of direct connection. Additionally, a heterogeneous machine farm 38 may include one or more servers 106 operating according to a type of operating system, while one or more other servers 106 execute one or more types of hypervisors rather than operating systems. In these embodiments, hypervisors may be used to emulate virtual hardware, partition physical hardware, virtualize physical hardware, and execute virtual machines that provide access to computing environments, allowing multiple operating systems to run concurrently on a host computer. Native hypervisors may run directly on the host computer. Hypervisors may include VMware ESX/ESXi, manufactured by VMWare, Inc., of Palo Alto, Calif.; the Xen hypervisor, an open source product whose development is overseen by Citrix Systems, Inc.; the HYPER-V hypervisors provided by Microsoft or others. Hosted hypervisors may run within an operating system on a second software level. Examples of hosted hypervisors may include VMware Workstation and VIRTUALBOX.

Management of the machine farm 38 may be de-centralized. For example, one or more servers 106 may comprise components, subsystems and modules to support one or more management services for the machine farm 38. In one of these embodiments, one or more servers 106 provide functionality for management of dynamic data, including techniques for handling failover, data replication, and increasing the robustness of the machine farm 38. Each server 106 may communicate with a persistent store and, in some embodiments, with a dynamic store.

Server 106 may be a file server, application server, web server, proxy server, appliance, network appliance, gateway, gateway server, virtualization server, deployment server, SSL VPN server, firewall, Internet of Things (IoT) controller. In one embodiment, the server 106 may be referred to as a remote machine or a node. In another embodiment, a plurality of nodes 290 may be in the path between any two communicating servers.

Figure 1B:
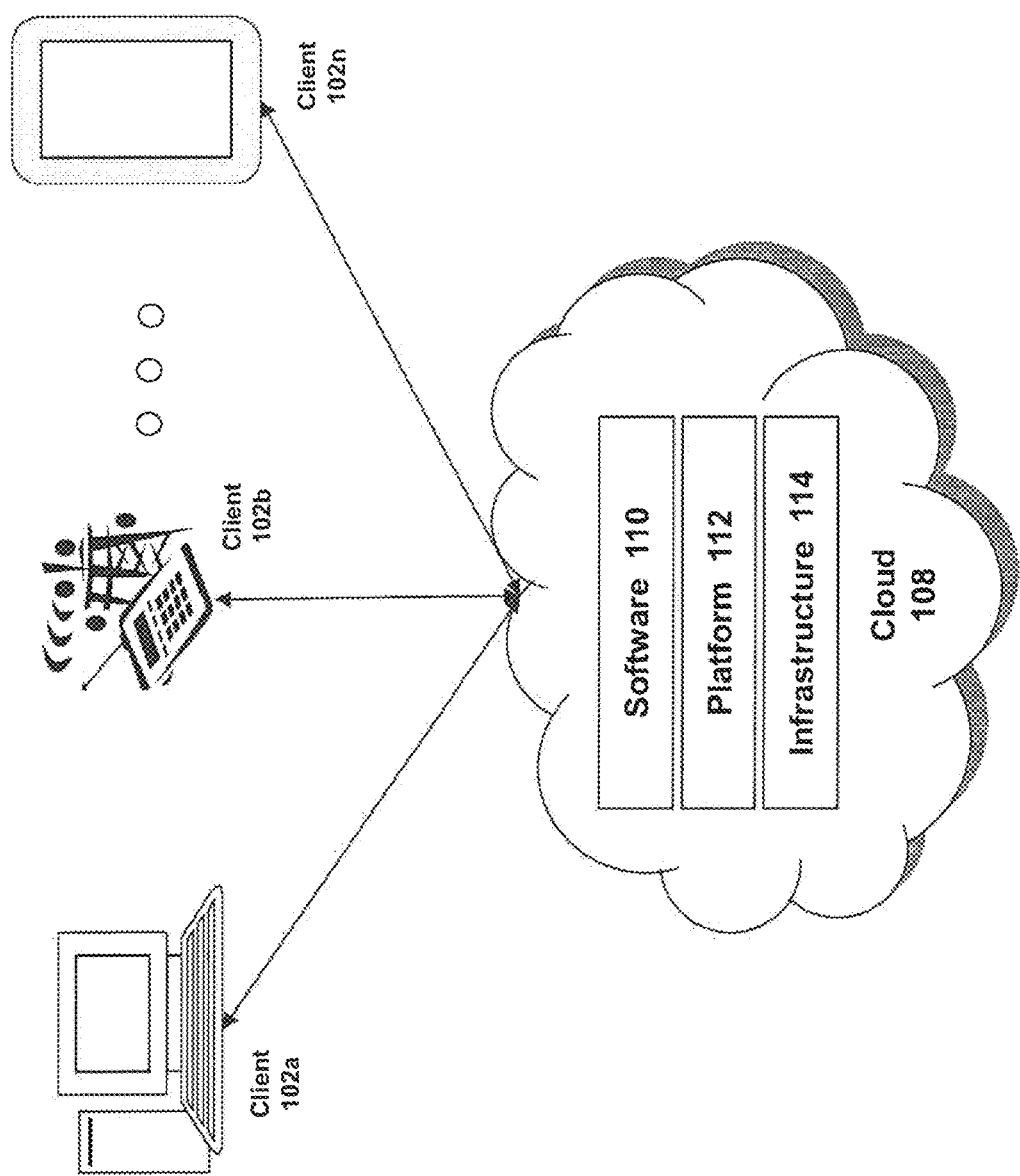
FIGS. 1B-1D are block diagrams depicting embodiments of computers useful in connection with the methods and systems described herein.

Referring to FIG. 1B, a cloud computing environment is depicted. The cloud computing environment can be part of the computing and network environment 10. A cloud computing environment may provide client 102 with one or more resources provided by the computing and network environment 10. The cloud computing environment may include one or more clients 102a-102n, in communication with the cloud 108 over one or more networks 104. Clients 102 may include, e.g., thick clients, thin clients, and zero clients. A thick client may provide at least some functionality even when disconnected from the cloud 108 or servers 106. A thin client or a zero client may depend on the connection to the cloud 108 or server 106 to provide functionality. A zero client may depend on the cloud 108 or other networks 104 or servers 106 to retrieve operating system data for the client device. The cloud 108 may include back end platforms, e.g., servers 106, storage, server farms or data centers.

The cloud 108 may be public, private, or hybrid. Public clouds may include public servers 106 that are maintained by third parties to the clients 102 or the owners of the clients. The servers 106 may be located off-site in remote geographical locations as disclosed above or otherwise. Public clouds may be connected to the servers 106 over a public network. Private clouds may include private servers 106 that are physically maintained by clients 102 or owners of clients. Private clouds may be connected to the servers 106 over a private network 104. Hybrid clouds 108 may include both the private and public networks 104 and servers 106.

The cloud 108 may also include a cloud based delivery, e.g. Software as a Service (SaaS) 110, Platform as a Service (PaaS) 112, and Infrastructure as a Service (IaaS) 114. IaaS may refer to a user renting the use of infrastructure resources that are needed during a specified time period. IaaS providers may offer storage, networking, servers or virtualization resources from large pools, allowing the users to quickly scale up by accessing more resources as needed. Examples of IaaS include AMAZON WEB SERVICES provided by Amazon.com, Inc., of Seattle, Wash., RACKSPACE CLOUD provided by Rackspace US, Inc., of San Antonio, Tex., Google Compute Engine provided by Google Inc. of Mountain View, Calif., or RIGHTSCALE provided by RightScale, Inc., of Santa Barbara, Calif. PaaS providers may offer functionality provided by IaaS, including, e.g., storage, networking, servers or virtualization, as well as additional resources such as, e.g., the operating system, middleware, or runtime resources. Examples of PaaS include WINDOWS AZURE provided by Microsoft Corporation of Redmond, Wash., Google App Engine provided by Google Inc., and HEROKU provided by Heroku, Inc. of San Francisco, Calif. SaaS providers may offer the resources that PaaS provides, including storage, networking, servers, virtualization, operating system, middleware, or runtime resources. In some embodiments, SaaS providers may offer additional resources including, e.g., data and application resources. Examples of SaaS include GOOGLE APPS provided by Google Inc., SALESFORCE provided by Salesforce.com Inc. of San Francisco, Calif., or OFFICE 365 provided by Microsoft Corporation. Examples of SaaS may also include data storage providers, e.g. DROPBOX provided by Dropbox, Inc. of San Francisco, Calif., Microsoft SKYDRIVE provided by Microsoft Corporation, Google Drive provided by Google Inc., or Apple ICLOUD provided by Apple Inc. of Cupertino, Calif.

Clients 102 may access IaaS resources with one or more IaaS standards, including, e.g., Amazon Elastic Compute Cloud (EC2), Open Cloud Computing Interface (OCCI), Cloud Infrastructure Management Interface (CIMI), or OpenStack standards. Some IaaS standards may allow clients access to resources over HTTP, and may use Representational State Transfer (REST) protocol or Simple Object Access Protocol (SOAP). Clients 102 may access PaaS resources with different PaaS interfaces. Some PaaS interfaces use HTTP packages, standard Java APIs, JavaMail API, Java Data Objects (JDO), Java Persistence API (JPA), Python APIs, web integration APIs for different programming languages including, e.g., Rack for Ruby, WSGI for Python, or PSGI for Perl, or other APIs that may be built on REST, HTTP, XML, or other protocols. Clients 102 may access SaaS resources through the use of web-based user interfaces, provided by a web browser (e.g. GOOGLE CHROME, Microsoft INTERNET EXPLORER, or Mozilla Firefox provided by Mozilla Foundation of Mountain View, Calif.). Clients 102 may also access SaaS resources through smartphone or tablet applications, including, for example, Salesforce Sales Cloud, or Google Drive app. Clients 102 may also access SaaS resources through the client operating system, including, e.g., Windows file system for DROP-BOX.

In some embodiments, access to IaaS, PaaS, or SaaS resources may be authenticated. For example, a server or authentication server may authenticate a user via security certificates, HTTPS, or API keys. API keys may include various encryption standards such as, e.g., Advanced Encryption Standard (AES). Data resources may be sent over Transport Layer Security (TLS) or Secure Sockets Layer (SSL).

Figure 1C:
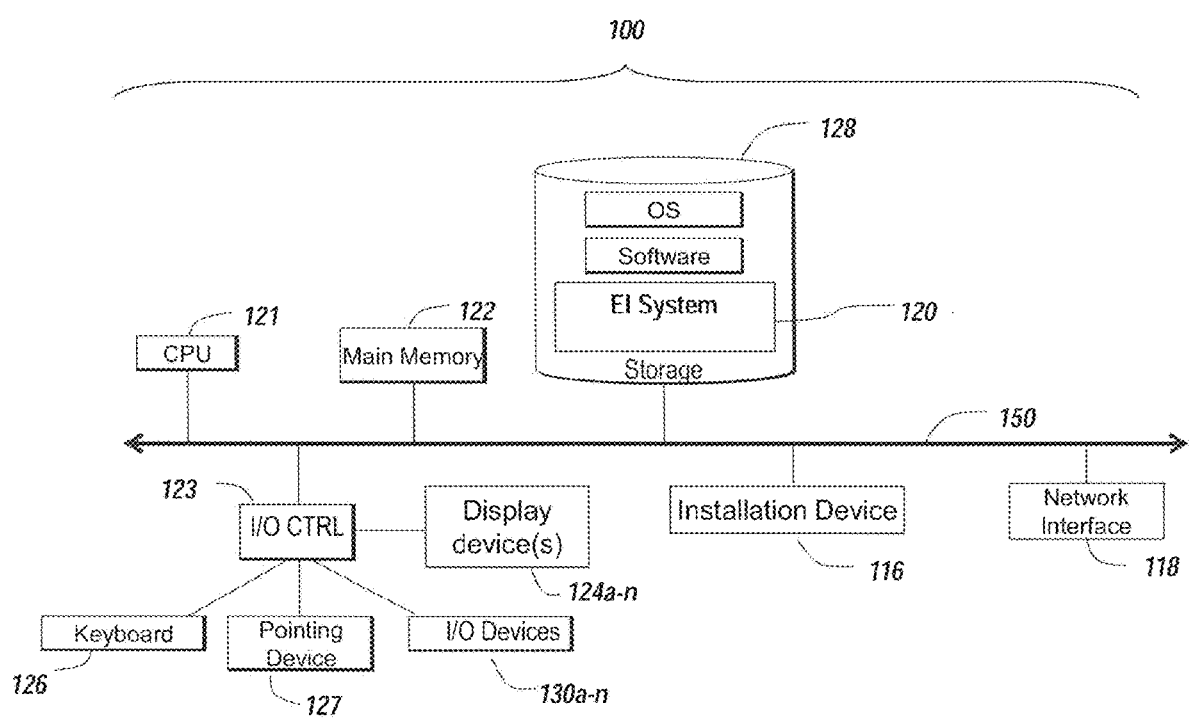
Figure 1D:
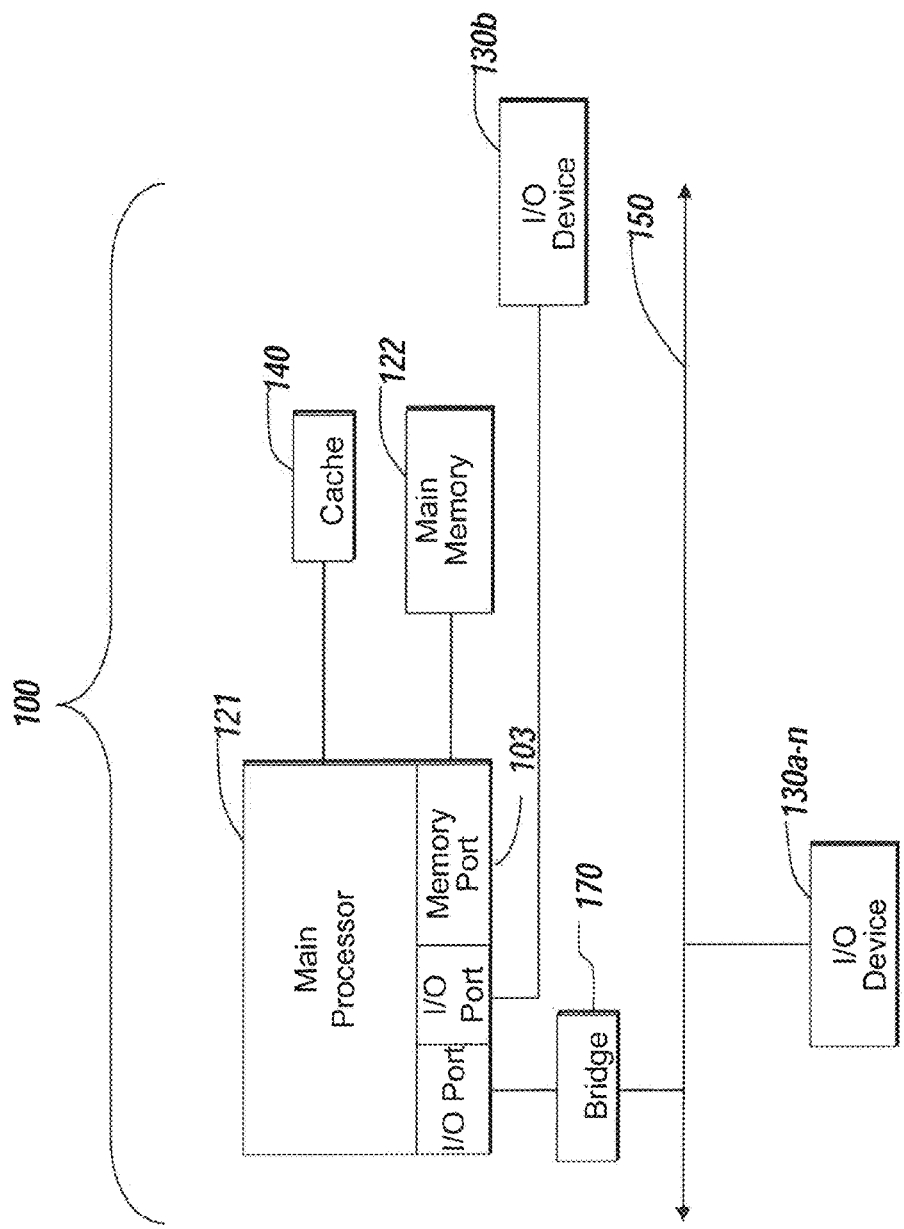

The client 102 and server 106 may be deployed as and/or executed on any type and form of computing device, e.g. a computer, network device or appliance capable of communicating on any type and form of network and performing the operations described herein. FIGS. 1C and 1D depict block diagrams of a computing device 100 useful for practicing an embodiment of the client 102 or a server 106. As shown in FIGS. 1C and 1D, each computing device 100 includes a central processing unit 121, and a main memory unit 122. As shown in FIG. 1C, a computing device 100 may include a storage device 128, an installation device 116, a network interface 118, an I/O controller 123, display devices 124a-124n, a keyboard 126 and a pointing device 127, e.g. a mouse. The storage device 128 may include, without limitation, an operating system, software, and a software of an education instrumentation (EI) system 120. As shown in FIG. 1D, each computing device 100 may also include additional optional elements, e.g. a memory port 103, a bridge 170, one or more input/output devices 130a-130n (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, e.g.: those manufactured by Intel Corporation of Mountain View, Calif.; those manufactured by Motorola Corporation of Schaumburg, Ill.; the ARM processor and TEGRA system on a chip (SoC) manufactured by Nvidia of Santa Clara, Calif.; the POWER7 processor, those manufactured by International Business Machines of White Plains, N.Y.; or those manufactured by Advanced Micro Devices of Sunnyvale, Calif. The computing device 100 may be based on any of these processors, or any other processor capable of operating as described herein. The central processing unit 121 may utilize instruction level parallelism, thread level parallelism, different levels of cache, and multi-core processors. A multi-core processor may include two or more processing units on a single computing component. Examples of a multi-core processors include the AMD PHENOM IIX2, INTEL CORE i5 and INTEL CORE i7.

Main memory unit 122 may include one or more memory chips capable of storing data and allowing any storage location to be directly accessed by the microprocessor 121. Main memory unit 122 may be volatile and faster than storage 128 memory. Main memory units 122 may be Dynamic random access memory (DRAM) or any variants, including static random access memory (SRAM), Burst SRAM or SynchBurst SRAM (BSRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Single Data Rate Synchronous DRAM (SDR SDRAM), Double Data Rate SDRAM (DDR SDRAM), Direct Rambus DRAM (DRDRAM), or Extreme Data Rate DRAM (XDR DRAM). In some embodiments, the main memory 122 or the storage 128 may be non-volatile; e.g., non-volatile read access memory (NVRAM), flash memory non-volatile static RAM (nvSRAM), Ferroelectric RAM (FeRAM), Magnetoresistive RAM (MRAM), Phase-change memory (PRAM), conductive-bridging RAM (CBRAM), Silicon-Oxide-Nitride-Oxide-Silicon (SONOS), Resistive RAM (RRAM), Racetrack, Nano-RAM (NRAM), or Millipede memory. The main memory 122 may be based on any of the above described memory chips, or any other available memory chips capable of operating as described herein. In the embodiment shown in FIG. 1C, the processor 121 communicates with main memory 122 via a system bus 150 (described in more detail below). FIG. 1D depicts an embodiment of a computing device 100 in which the processor communicates directly with main memory 122 via a memory port 103. For example, in FIG. 1D the main memory 122 may be DRDRAM.

FIG. 1D depicts an embodiment in which the main processor 121 communicates directly with cache memory 140 via a secondary bus, sometimes referred to as a backside bus. In other embodiments, the main processor 121 communicates with cache memory 140 using the system bus 150. Cache memory 140 typically has a faster response time than main memory 122 and is typically provided by SRAM, BSRAM, or EDRAM. In the embodiment shown in FIG. 1D, the processor 121 communicates with various I/O devices 130 via a local system bus 150. Various buses may be used to connect the central processing unit 121 to any of the I/O devices 130, including a PCI bus, a PCI-X bus, or a PCI-Express bus, or a NuBus. For embodiments in which the I/O device is a video display 124, the processor 121 may use an Advanced Graphics Port (AGP) to communicate with the display 124 or the I/O controller 123 for the display 124. FIG. 1D depicts an embodiment of a computer 100 in which the main processor 121 communicates directly with I/O device 130b or other processors 121' via HYPERTRANSPORT, RAPIDIO, or INFINIBAND communications technology. FIG. 1D also depicts an embodiment in which local busses and direct communication are mixed: the processor 121 communicates with I/O device 130a using a local interconnect bus while communicating with I/O device 130b directly.

A wide variety of I/O devices 130a-130n may be present in the computing device 100. Input devices may include keyboards, mice, trackpads, trackballs, touchpads, touch mice, multi-touch touchpads and touch mice, microphones, multi-array microphones, drawing tablets, cameras, single-lens reflex camera (SLR), digital SLR (DSLR), CMOS sensors, accelerometers, infrared optical sensors, pressure sensors, magnetometer sensors, angular rate sensors, depth sensors, proximity sensors, ambient light sensors, gyroscopic sensors, or other sensors. Output devices may include video displays, graphical displays, speakers, headphones, inkjet printers, laser printers, and 3D printers.

Devices 130a-130n may include a combination of multiple input or output devices, including, e.g., Microsoft KINECT, Nintendo Wiimote for the WII, Nintendo WII U GAMEPAD, or Apple IPHONE. Some devices 130a-130n allow gesture recognition inputs through combining some of the inputs and outputs. Some devices 130a-130n provides for facial recognition which may be utilized as an input for different purposes including authentication and other commands. Some devices 130a-130n provides for voice recognition and inputs, including, e.g., Microsoft KINECT, SIRI for IPHONE by Apple, Google Now or Google Voice Search.

Additional devices 130a-130n have both input and output capabilities, including, e.g., haptic feedback devices, touchscreen displays, or multi-touch displays. Touchscreen, multi-touch displays, touchpads, touch mice, or other touch sensing devices may use different technologies to sense touch, including, e.g., capacitive, surface capacitive, projected capacitive touch (PCT), in-cell capacitive, resistive, infrared, waveguide, dispersive signal touch (DST), in-cell optical, surface acoustic wave (SAW), bending wave touch (BWT), or force-based sensing technologies. Some multi-touch devices may allow two or more contact points with the surface, allowing advanced functionality including, e.g., pinch, spread, rotate, scroll, or other gestures. Some touchscreen devices, including, e.g., Microsoft PIXELSENSE or Multi-Touch Collaboration Wall, may have larger surfaces, such as on a table-top or on a wall, and may also interact with other electronic devices. Some I/O devices 130a-130n, display devices 124a-124n or group of devices may be augment reality devices. The I/O devices may be controlled by an I/O controller 123 as shown in FIG. 1C. The I/O controller may control one or more I/O devices, such as, e.g., a keyboard 126 and a pointing device 127, e.g., a mouse or optical pen. Furthermore, an I/O device may also provide storage and/or an installation medium 116 for the computing device 100. In still other embodiments, the computing device 100 may provide USB connections (not shown) to receive handheld USB storage devices. In further embodiments, an I/O device 130 may be a bridge between the system bus 150 and an external communication bus, e.g. a USB bus, a SCSI bus, a FireWire bus, an Ethernet bus, a Gigabit Ethernet bus, a Fibre Channel bus, or a Thunderbolt bus.

In some embodiments, display devices 124a-124n may be connected to I/O controller 123. Display devices may include, e.g., liquid crystal displays (LCD), thin film transistor LCD (TFT-LCD), blue phase LCD, electronic papers (e-ink) displays, flexile displays, light emitting diode displays (LED), digital light processing (DLP) displays, liquid crystal on silicon (LCOS) displays, organic light-emitting diode (OLED) displays, active-matrix organic light-emitting diode (AMOLED) displays, liquid crystal laser displays, time-multiplexed optical shutter (TMOS) displays, or 3D displays. Examples of 3D displays may use, e.g. stereoscopy, polarization filters, active shutters, or autostereoscopy. Display devices 124a-124n may also be a head-mounted display (HMD). In some embodiments, display devices 124a-124n or the corresponding I/O controllers 123 may be controlled through or have hardware support for OPENGL or DIRECTX API or other graphics libraries.

In some embodiments, the computing device 100 may include or connect to multiple display devices 124a-124n, which each may be of the same or different type and/or form. As such, any of the I/O devices 130a-130n and/or the I/O controller 123 may include any type and/or form of suitable hardware, software, or combination of hardware and software to support, enable or provide for the connection and use of multiple display devices 124a-124n by the computing device 100. For example, the computing device 100 may include any type and/or form of video adapter, video card, driver, and/or library to interface, communicate, connect or otherwise use the display devices 124a-124n. In one embodiment, a video adapter may include multiple connectors to interface to multiple display devices 124a-124n. In other embodiments, the computing device 100 may include multiple video adapters, with each video adapter connected to one or more of the display devices 124a-124n. In some embodiments, any portion of the operating system of the computing device 100 may be configured for using multiple displays 124a-124n. In other embodiments, one or more of the display devices 124a-124n may be provided by one or more other computing devices 100a or 100b connected to the computing device 100, via the network 104. In some embodiments software may be designed and constructed to use another computer's display device as a second display device 124a for the computing device 100. For example, in one embodiment, an Apple iPad may connect to a computing device 100 and use the display of the device 100 as an additional display screen that may be used as an extended desktop. One ordinarily skilled in the art will recognize and appreciate the various ways and embodiments that a computing device 100 may be configured to have multiple display devices 124a-124n.

Referring again to FIG. 1C, the computing device 100 may comprise a storage device 128 (e.g. one or more hard disk drives or redundant arrays of independent disks) for storing an operating system or other related software, and for storing application software programs such as any program related to the software for the education instrumentation (EI) system 120. Examples of storage device 128 include, e.g., hard disk drive (HDD); optical drive including CD drive, DVD drive, or BLU-RAY drive; solid-state drive (SSD); USB flash drive; or any other device suitable for storing data. Some storage devices may include multiple volatile and non-volatile memories, including, e.g., solid state hybrid drives that combine hard disks with solid state cache. Some storage device 128 may be non-volatile, mutable, or read-only. Some storage device 128 may be internal and connect to the computing device 100 via a bus 150. Some storage device 128 may be external and connect to the computing device 100 via a I/O device 130 that provides an external bus. Some storage device 128 may connect to the computing device 100 via the network interface 118 over a network 104, including, e.g., the Remote Disk for MACBOOK AIR by Apple. Some client devices 100 may not require a non-volatile storage device 128 and may be thin clients or zero clients 102. Some storage device 128 may also be used as an installation device 116, and may be suitable for installing software and programs. Additionally, the operating system and the software can be run from a bootable medium, for example, a bootable CD, e.g. KNOPPIX, a bootable CD for GNU/Linux that is available as a GNU/Linux distribution from knoppix.net.

Client device 100 may also install software or application from an application distribution platform. Examples of application distribution platforms include the App Store for iOS provided by Apple, Inc., the Mac App Store provided by Apple, Inc., GOOGLE PLAY for Android OS provided by Google Inc., Chrome Webstore for CHROME OS provided by Google Inc., and Amazon Appstore for Android OS and KINDLE FIRE provided by Amazon.com, Inc. An application distribution platform may facilitate installation of software on a client device 102. An application distribution platform may include a repository of applications on a server 106 or a cloud 108, which the clients 102a-102n may access over a network 104. An application distribution platform may include application developed and provided by various developers. A user of a client device 102 may select, purchase and/or download an application via the application distribution platform.

Furthermore, the computing device 100 may include a network interface 118 to interface to the network 104 through a variety of connections including, but not limited to, standard telephone lines LAN or WAN links (e.g., 802.11, T1, T3, Gigabit Ethernet, Infiniband), broadband connections (e.g., ISDN, Frame Relay, ATM, Gigabit Ethernet, Ethernet-over-SONET, ADSL, VDSL, BPON, GPON, fiber optical including FiOS), wireless connections, or some combination of any or all of the above. Connections can be established using a variety of communication protocols (e.g., TCP/IP, Ethernet, ARCNET, SONET, SDH, Fiber Distributed Data Interface (FDDI), IEEE 802.11a/b/g/n/ac CDMA, GSM, WiMax and direct asynchronous connections). In one embodiment, the computing device 100 communicates with other computing devices 100' via any type and/or form of gateway or tunneling protocol e.g. Secure Socket Layer (SSL) or Transport Layer Security (TLS), or the Citrix Gateway Protocol manufactured by Citrix Systems, Inc. of Ft. Lauderdale, Fla. The network interface 118 may comprise a built-in network adapter, network interface card, PCMCIA network card, EXPRESSCARD network card, card bus network adapter, wireless network adapter, USB network adapter, modem or any other device suitable for interfacing the computing device 100 to any type of network capable of communication and performing the operations described herein.

A computing device 100 of the sort depicted in FIGS. 1B and 1C may operate under the control of an operating system, which controls scheduling of tasks and access to system resources. The computing device 100 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: WINDOWS 2000, WINDOWS Server 2012, WINDOWS CE, WINDOWS Phone, WINDOWS XP, WINDOWS VISTA, and WINDOWS 7, WINDOWS RT, and WINDOWS 8 all of which are manufactured by Microsoft Corporation of Redmond, Wash.; MAC OS and iOS, manufactured by Apple, Inc. of Cupertino, Calif.; and Linux, a freely-available operating system, e.g. Linux Mint distribution ("distro") or Ubuntu, distributed by Canonical Ltd. of London, United Kingdom; or Unix or other Unix-like derivative operating systems; and Android, designed by Google, of Mountain View, Calif., among others. Some operating systems, including, e.g., the CHROME OS by Google, may be used on zero clients or thin clients, including, e.g., CHROMEBOOKS.

The computer system 100 can be any workstation, telephone, desktop computer, laptop or notebook computer, netbook, ULTRABOOK, tablet, server, handheld computer, mobile telephone, smartphone or other portable telecommunications device, media playing device, a gaming system, mobile computing device, or any other type and/or form of computing, telecommunications or media device that is capable of communication. The computer system 100 has sufficient processor power and memory capacity to perform the operations described herein. In some embodiments, the computing device 100 may have different processors, operating systems, and input devices consistent with the device. The Samsung GALAXY smartphones, e.g., operate under the control of Android operating system developed by Google, Inc. GALAXY smartphones receive input via a touch interface.

In some embodiments, the computing device 100 is a gaming system. For example, the computer system 100 may comprise a PLAYSTATION 3, or PERSONAL PLAYSTATION PORTABLE (PSP), or a PLAYSTATION VITA device manufactured by the Sony Corporation of Tokyo, Japan, a NINTENDO DS, NINTENDO 3DS, NINTENDO WII, or a NINTENDO WII U device manufactured by Nintendo Co., Ltd., of Kyoto, Japan, an XBOX 360 device manufactured by the Microsoft Corporation of Redmond, Wash.

In some embodiments, the computing device 100 is a digital audio player such as the Apple IPOD, IPOD Touch, and IPOD NANO lines of devices, manufactured by Apple Computer of Cupertino, Calif. Some digital audio players may have other functionality, including, e.g., a gaming system or any functionality made available by an application from a digital application distribution platform. For example, the IPOD Touch may access the Apple App Store. In some embodiments, the computing device 100 is a portable media player or digital audio player supporting file formats including, but not limited to, MP3, WAV, M4A/AAC, WMA Protected AAC, AIFF, Audible audiobook, Apple Lossless audio file formats and .mov, .m4v, and .mp4 MPEG-4 (H.264/MPEG-4 AVC) video file formats.

In some embodiments, the computing device 100 is a tablet e.g. the IPAD line of devices by Apple; GALAXY TAB family of devices by Samsung; or KINDLE FIRE, by Amazon.com, Inc. of Seattle, Wash. In other embodiments, the computing device 100 is a eBook reader, e.g. the KINDLE family of devices by Amazon.com, or NOOK family of devices by Barnes & Noble, Inc. of New York City, N.Y.

In some embodiments, the communications device 102 includes a combination of devices, e.g. a smartphone combined with a digital audio player or portable media player. For example, one of these embodiments is a smartphone, e.g. the IPHONE family of smartphones manufactured by Apple, Inc.; a Samsung GALAXY family of smartphones manufactured by Samsung, Inc.; or a Motorola DROID family of smartphones. In yet another embodiment, the communications device 102 is a laptop or desktop computer equipped with a web browser and a microphone and speaker system, e.g. a telephony headset. In these embodiments, the communications devices 102 are web-enabled and can receive and initiate phone calls. In some embodiments, a laptop or desktop computer is also equipped with a webcam or other video capture device that enables video chat and video call.

In some embodiments, the status of one or more machines 102, 106 in the network 104 is monitored, generally as part of network management. In one of these embodiments, the status of a machine may include an identification of load information (e.g., the number of processes on the machine, central processing unit (CPU) and memory utilization), of port information (e.g., the number of available communication ports and the port addresses), or of session status (e.g., the duration and type of processes, and whether a process is active or idle). In another of these embodiments, this information may be identified by a plurality of metrics, and the plurality of metrics can be applied at least in part towards decisions in load distribution, network traffic management, and network failure recovery as well as any aspects of operations of the present solution described herein. Aspects of the operating environments and components described above will become apparent in the context of the systems and methods disclosed herein.

B. Computer Environment for Instrumentation of Education Processes

Figure 2A:
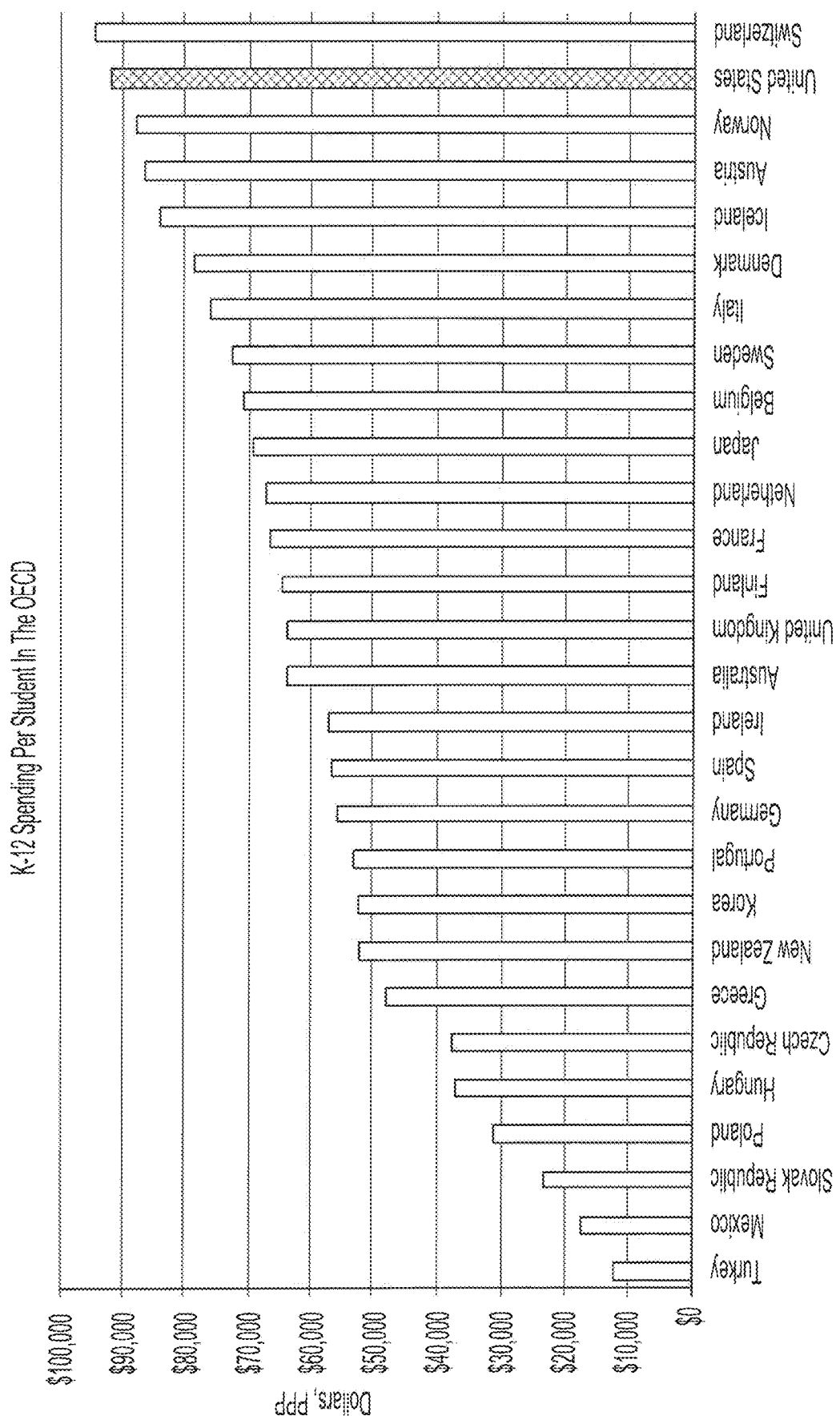
FIGS. 2A and 2B show charts illustrating, respectively, the average spending per student and the numeracy proficiency scores for a plurality of countries.
Figure 2B:
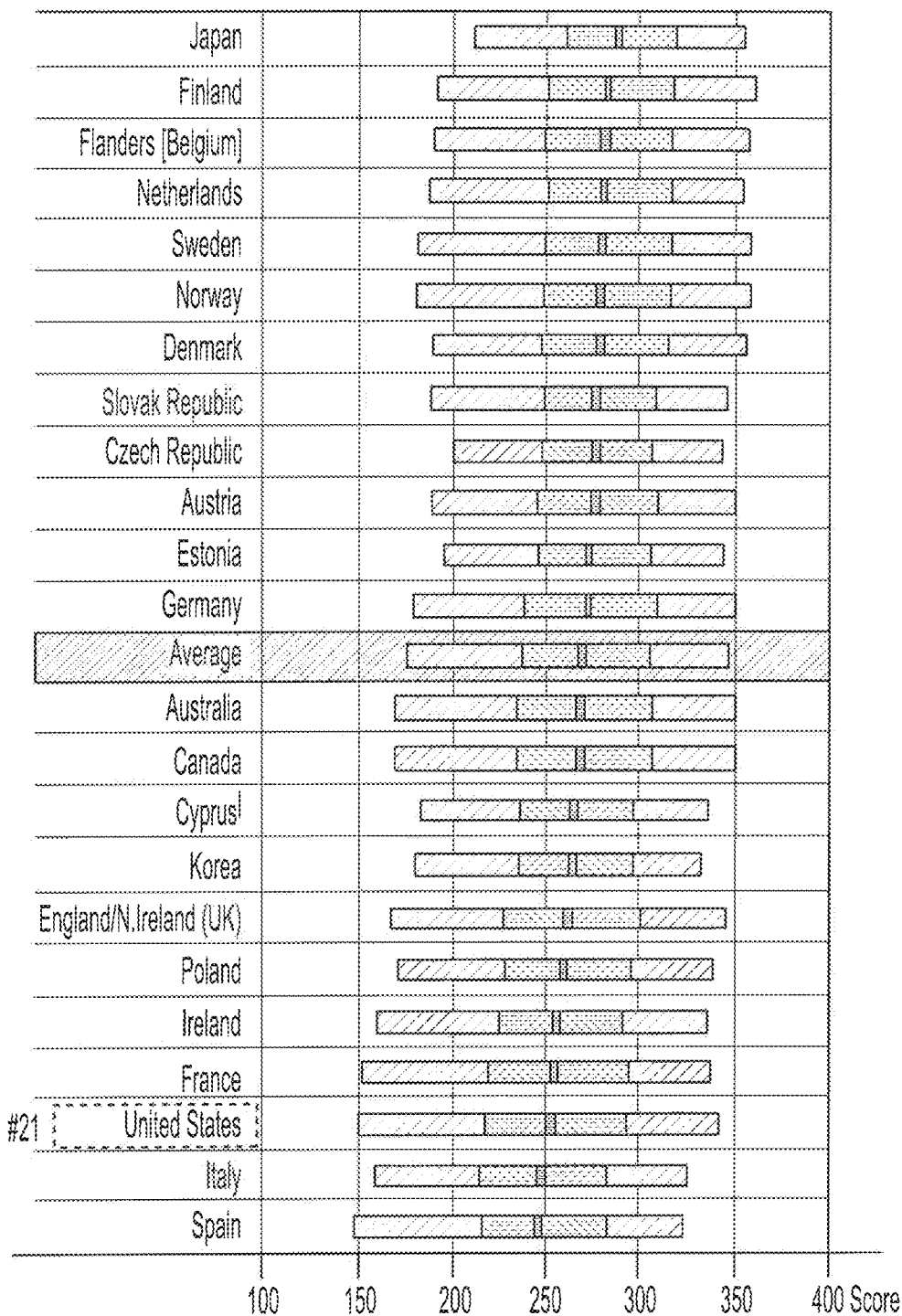

FIGS. 2A and 2B show charts illustrating, respectively, the average spending per student and the numeracy proficiency scores for a plurality of countries. By comparing the ranking of any given country in terms of the average spending per student to the respective ranking of the same country in terms of the numeracy proficiency score, one can see that increased spending per student does not necessarily translate into higher academic performance. For example, the United States of America while having the second highest spending amount per student (more than $90,000 per student) is only ranked $21^{st}$ in terms of the numeracy proficiency scores. In contrast to the United States of America, the Slovak Republic spends only about $23,000 per student and is ranked $8^{th}$ in terms of the numeracy proficiency scores.

Considering the spending amount per student data and the numeracy proficiency scores shown in FIGS. 2A and 2B, one can conclude that transforming education or education systems to improve academic performance and increase student learning outcomes may not be achieved simply by increasing money spending on education. In fact, an education system is a very complex environment with a multitude of factors that influence the education process (e.g., education policies, education strategies, and/or education operations) and student performance. Such factors interact with each other, and are inter-dependent, in a complex and dynamic way. The complexity of the education process makes it substantially difficult to construct an information model that describes fully and accurately a real word education system (or education process), can accommodate various circumstances, and can provide diagnostic or interventional analysis.

An educational system as a multilevel environment can include factors related to students, one or more schools, one or more school districts, one or more states, or one or more countries associated with that educational system. However, many existing studies of educational systems do not typically take into account the full spectrum of potential factors and levels due to the complexity of the challenge. On the other hand innovation and technology can play a significant role in collecting, storing, and transforming the data achieved from education systems to a level where they can guide and help in daily decision making processes and other purposes. This is especially possible, when the used models are white-box-type of models enabling persons not having statistical background to interpret and use the model outcomes.

Computerized education instrumentation (EPI) systems and methods of the current disclosure include one or more processors generating one or more models of a multitude of factors (or variables) that can influence education processes. The one or more processors can translate the generated models into intuitive visual (or graphical) representations to help understand the relative importance of the variables and their inter-dependencies. Contrary to classical statistical analysis methods which may formulate complex relationships among variables as high-degree equations, the graphical representations corresponding to the generated models can enable people with non-technical background to easily comprehend the degree of influence of various variables on the education process and the learning outcomes. Based on the generated models, the one or more processors can provide predictions of learning outcomes, and enable educated scenario planning to improve the performance of the education process. A computer platform (also referred to as EDLIGO™ platform) implementing the education instrumentation systems and methods of the current disclosure can enable observability and educated controllability of the education process(es).

The education process can be defined, or described, in terms of an information theory perspective, where students act as "receivers" and education agencies (e.g., government, ministry of education, school district, school board, teacher/professor, etc.) act as "transmitters." The content of, and goals behind, a curriculum, program, or course that is set by one or more education agencies (e.g., "transmitter(s)") can represent the information sent from the "transmitter(s)" to the "receivers" (e.g., students). The difference between the curriculum, program, or course as set by the education agency and the learning outcome (e.g., learning that students achieved and can reliably demonstrate at a given time point of the education process) represent the information loss between the "transmitter(s)" and the "receivers." The information loss is caused by at least a subset of the multitude of variables related to the education process and/or the education system(s). By modeling these variables, the education instrumentation systems and methods of the current disclosure can identify the relative contribution of various factors (or variables) to the increase or decrease of information loss between the "transmitter(s)" and "receivers." Using generated models, the education instrumentation systems and methods of the current disclosure can predict learning outcomes and/or recommend one or more action plans to improve the performance of education processes or education systems.

Figure 3:
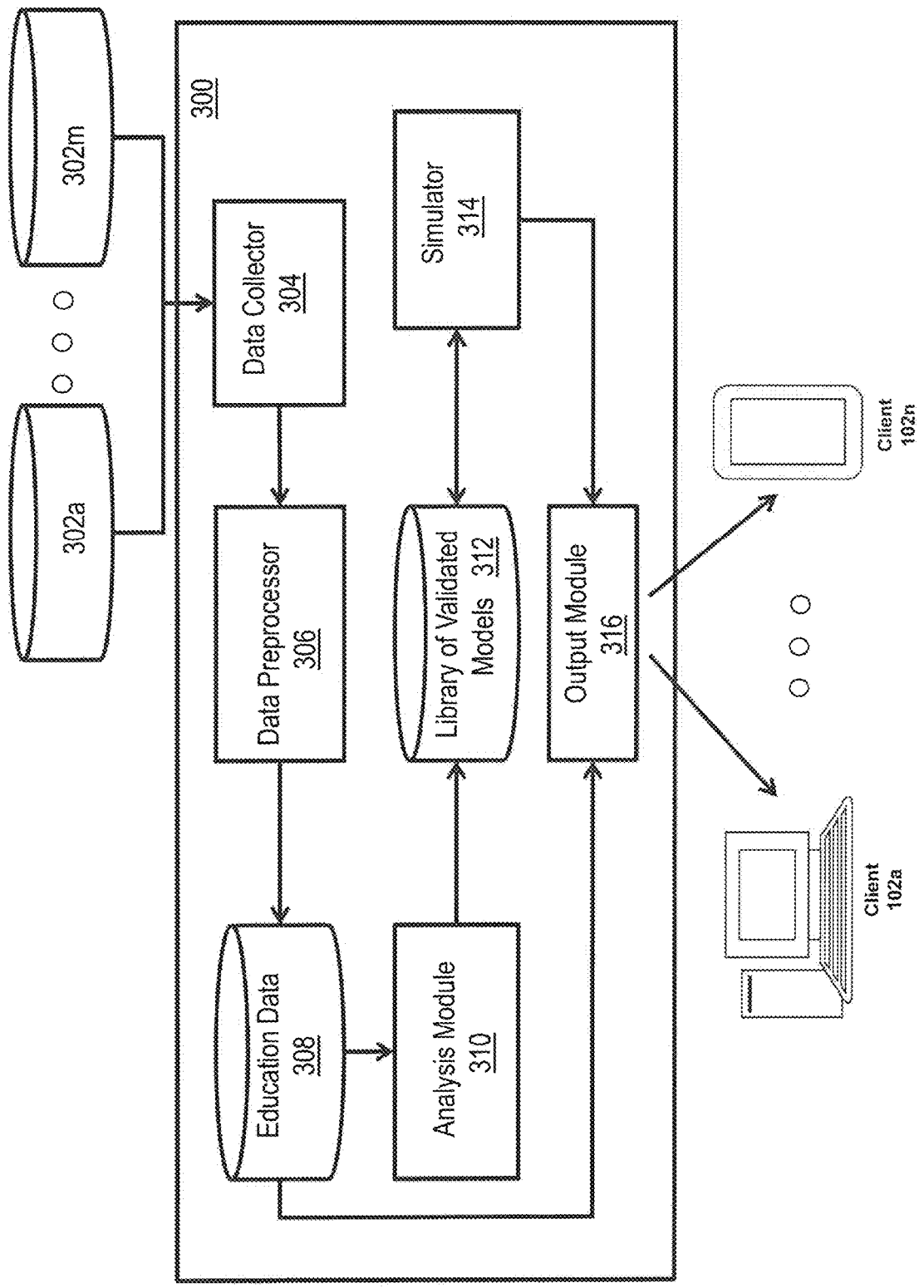
FIG. 3 shows a diagram illustrating an education instrumentation (EI) computer platform, according to one or more embodiments.

Referring to FIG. 3, an education instrumentation (EI) computer platform can include an education instrumentation (EI) system 300, a plurality of external data bases 302a-m (referred to hereinafter individually or collectively as external database(s) 302), and a plurality of client devices 102a-n (also referred to individually or collectively as client device(s) 102). The EI system 300 can include a data collector 304, a data preprocessor 306, a database 308, an analysis module 310, a library of validated models 312, a simulation module 314, and an output module 316.

The EI system 300 can include, or can be implemented on, one or more computing devices, such as server(s) 106 (shown in FIG. 1A) or cloud 108 (shown in FIG. 1B). The EI system 300 can be communicatively coupled the external databases 302 and the client devices 102 through one or more communication networks, such as network 104 described above with regard to FIG. 1A.

The external databases 302 can include one or more student information systems (SISs), one or more administration databases, one or more education benchmarking data sources, one or more learning management system (LMS) data sources, one or more assessment data sources, or a combination thereof. The data collector 304 can receive (or import) a variety of data sets, from the external databases 302, related to various aspects of education. The data collector 304 can include one or more application program interfaces (APIs) for accessing the external data bases 302. The data collector 304 can receive student information data (e.g., name, ID, age, gender, parents' education level(s), parents' occupations, social/cultural/economic background information, academic performance, behavior, attendance, etc.), class or grade information data (e.g., class size(s), teacher-student ratio, extra curriculum activities, etc.), books' information data (e.g., books used in each subject), educational applications' information data (e.g., computer or mobile applications used in school), school facilities' information data, or a combination thereof from the student information system(s). An Administration database can provide data related to qualifications, skills, professional development or paygrades of principals, teachers, and/or staff associated with one or more schools. Administration databases can also provide budgeting and expenditure information data, such as education budgets for various school districts, schools budgets, programs' budgets.

The education benchmarking data source(s) can include websites or databases associated with the Program for International Student Assessment (PISA), Trends in International Mathematics and Science Study (TIMSS), Progress in International Reading Literacy Study (PIRLS), Smarter Balanced Assessment Consortium in USA, other National or International Benchmarking organizations/institutions (e.g., State Departments of Education, OECD, World Bank, or UNESCO), or a combination thereof.

The PISA data is generated through a worldwide study by the Organization for Economic Co-operation and Development (OECD) in member and non-member nations of 15-year-old school pupils' scholastic performance on mathematics, science, and reading. It was first performed in 2000 and then repeated every three years. It is done with a view to improving education policies and outcomes. It measures problem solving and cognition in daily life. 470,000 15-year-old students representing 65 nations and territories participated in PISA 2009. An additional 50,000 students representing nine nations were tested in 2010.

The Trends in International Mathematics and Science Study (TIMSS) data sources provide a series of international assessments of the mathematics and science knowledge of students around the world. The participating students come from a diverse set of educational systems (countries or regional jurisdictions of countries) in terms of economic development, geographical location, and population size. In each of the participating educational systems, a minimum of 4,500 to 5,000 students are evaluated. Furthermore, for each student, contextual data on the learning conditions in mathematics and science are collected from the participating students, their teachers and their principals via separate questionnaires. TIMSS is one of the studies established by the International Association for the Evaluation of Educational Achievement (IEA) aimed at allowing educational systems to compare students' educational achievement and learn from the experiences of others in designing effective education policy. This study was first conducted in 1995, and has been performed every 4 years thereafter. In most of the cycles the study assesses 4th and 8th grade students. Therefore, some of the participating educational systems have trend data across assessments from 1995 to 2011.

The Progress in International Reading Literacy Study (PIRLS) is an international study of reading achievement for fourth graders. It is conducted by the International Association for the Evaluation of Educational Achievement (IEA). The studies are designed to measure students' reading literacy achievement, to provide a baseline for future studies of trends in achievement, and to gather information about students' home and school experiences in learning to read. PIRLS 2006 tested 215,000 students from 46 educational systems. PIRLS 2011 (the most recent cycle) testing has been done and the results were published December 2012.

LMS data sources can include websites or databases providing information related to curriculum standards (e.g. Common Core), learning objectives, course design information, or a combination thereof. Assessment data sources can include websites or databases that provide standardized tests scores/results (e.g. Smarter Balanced scores).

The data collector 304 can receive data from client devices 102. For instance, the data collector 304 can receive lesson planning data, teacher notes data from client devices associated with teachers, professors, or educational staff. The data collector 304 can receive other data, such as surveys (e.g. student surveys, community surveys, parents feedback), or other manually input data (e.g., spreadsheets), social media data from social networks, or other online data (e.g., from teacher or school rating websites).

The data preprocessor 306 can preprocess data received by the data collector 304 and store the preprocessed data in the database 308. The data preprocessor 306 can delete or remove incomplete data (e.g., data with many missing values), incorrect data (e.g., remove outliers by using well known proximity-based outlier detection algorithm), improperly formatted data (e.g., due to corruption), data redundancies (e.g., remove data duplicates). For example, many of the individual survey question (or respective indices) can contain often a large portion of missing values, which makes them useless in the analysis. Therefore, while certain indices, with a significant portion of missing values, may be interesting, they may not be reliable with regard to data analysis due to a large number of missing values (e.g., higher than 30%). The data preprocessor 306 can estimate missing values in one or more data sets (e.g. using Expected Maximization algorithm). The data preprocessor 306 can normalize data (e.g., by applying weighting) to remove or alleviate any data biases or can smooth some data values (e.g., by averaging) in order to find trends. The data preprocessor 306 can also merge various data elements received from different sources together. The data preprocessor 306 can store preprocessed data in the database 308.

The database 308 can be configured to store preprocessed data according to one or more specific formats. For instance, the database 308 can organize various data sets according to various variables (or factors) having potential influence on student performance. Such variables (or factors) can include student behavior, student's social, cultural or economic background, parents' educational level, family structure, school size, school resources, class size, student-teacher ratio, teacher qualifications, extra-curriculum activities, or a combination thereof. The database 308 can classify preprocessed data sets based on, for example, respective data sources, dates, or geographical areas.

The analysis module 310 can analyze the collected data (e.g., the preprocessed data stored in database 308) to generate a plurality of models that represent one or more education processes. The generated models can include mathematical or statistical models that simulate the impact or effect of various factors or variables in the collected data on various learning outcomes. For example, the analysis module 310 can be configured to generate Bayesian networks, directed acyclic graphs, neural networks, or convolutional networks. Each generated model can illustrate the inter-dependencies between distinct data variables and the contribution of each data variable to a learning outcome for a given education process. As an illustrative example, a generated model can illustrate the inter-dependencies between factors such as student behavior, student's social, cultural or economic background, parents' educational level, family structure, school size, school resources, class size, student-teacher ratio, teacher qualifications, extra-curriculum activities, and how these factors affect learning outcome in math.

The analysis module 310, or the generated models, may identify important factors (or dominant variables) with respect to affecting the academic performance of students in one or more subjects. Identifying such dominant data variables (or important factors) can allow teachers, faculty, principals, superintendents and policy makers to make educated conclusions and take the "proper" action(s) to maximize positive impact on student learning outcomes. The analysis module 310 can be configured to perform deep and objective data analysis (e.g., with non-bias) of collected education data and provide visually meaningful data models (e.g., Bayesian networks, directed acyclic networks, neural networks, convolutional networks) analytics representative of key factors (such as dominant factors) that can predict and often also directly influence the academic performance at the individual or group level. The analysis module 310 can use, for example, standards frameworks data (e.g., PISA data, TIMSS data, PERLS data, or Smarter Balanced Assessment Consortium data), curriculum or lesson planning data, assessment data, professional development data, student engagement data, personalized learning experience data, SIS data, LMS data, budgeting data, etc., as training data to generate the models. The generated models can determine dependencies (or correlations) between variables across various data types or data sets, and quantify (or estimate) the impact of such variables on learning outcomes.

Figure 4:
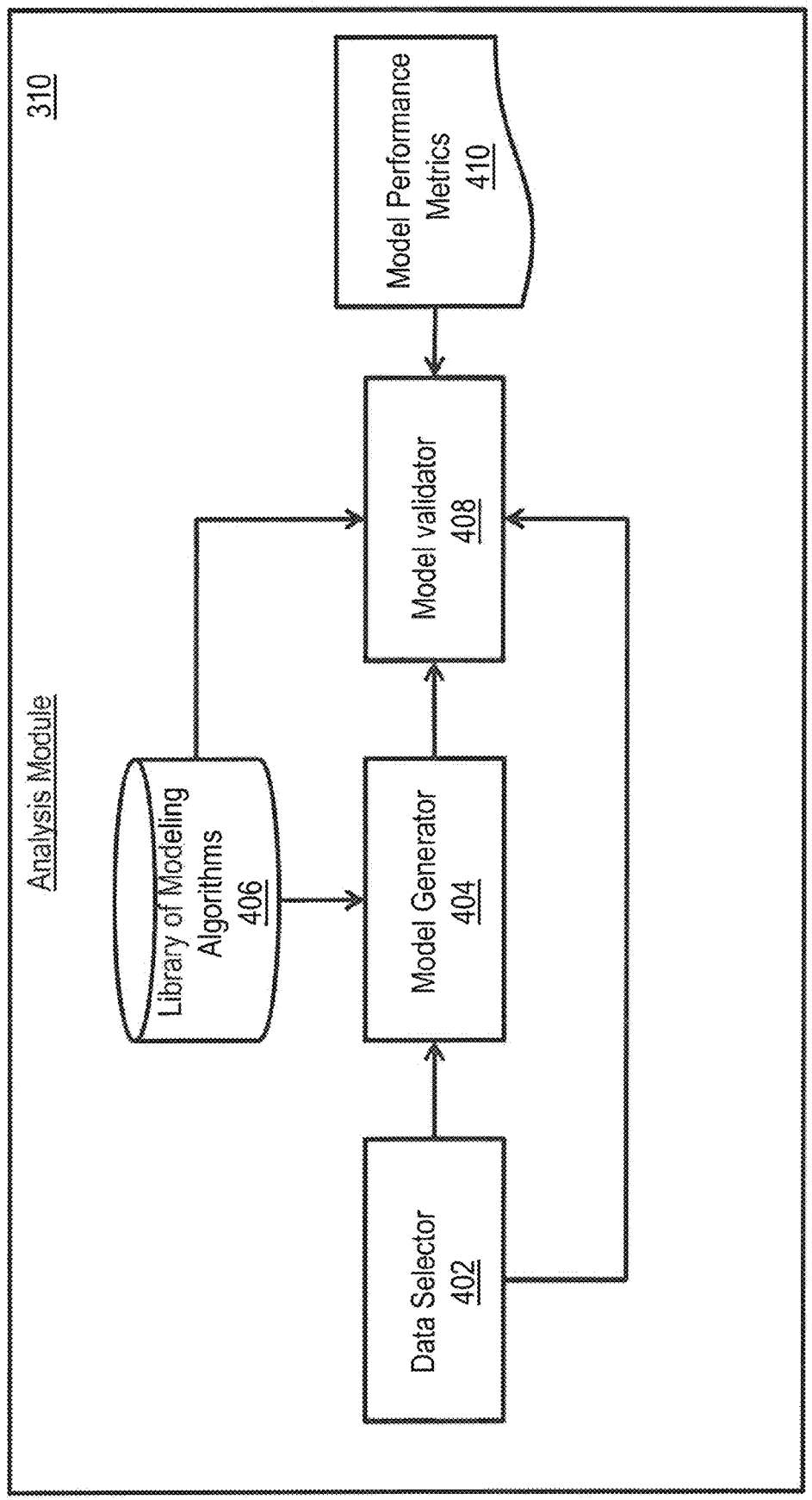
FIG. 4 shows a block diagram illustrating an architecture of an analysis module illustrated in FIG. 3, according to one or more embodiments.

FIG. 4 shows a block diagram illustrating an architecture of the analysis module 310, according to one or more embodiments. The analysis module 310 can include a data selector 402, a model generator 404, a library of modeling algorithms 406, a model validator 408, and a model performance metrics' file or data structure.

The data selector 402 can select one or more data subsets from the data sets stored in database 308 for use as training data to generate a given model or as test data to validate a generated model. For example, the data selector can select one or more subsets of PISA data, TIMSS data, PIRLS data, Smarter Balanced Assessment Consortium data, or other National or International Benchmarking data stored in the database 308 for use as training data. For example, the PISA data sets stored in the database 308 can include results from surveys organized by OECD and conducted by education authorities in different countries and for different years (e.g., 2006, 2009, 2012, 2015). The data selector 402 can select a subset of these data sets, for example, related to a specific year (e.g., 20115), a specific country (e.g., U.S.), and/or a specific subject or field (e.g., math, science or reading). The data selector 402 can also select data subset(s) from data sets including background information obtained from students and schools, individual survey results from students and schools, performance result in mathematics, science and reading for a plurality of students, indices representing summaries that describe sets of individual surveys (these indices are defined and pre-calculated by OECD authorities), statistical data associated with students, schools or school districts (e.g., for weighting the selected data to avoid bias in analysis).

In selecting training or test data, the data selector can take into account the total number of variables or the type of variables to use in generating a model. For example, data sets (such as PISA, TIMMS, PERLS or Smarter Balanced Assessment Consortium data sets) can include about 500 or even more variables per data set with significant multi-collinearity between many variables (correlations or dependencies between variables in the same set). These correlations or dependencies between such large number of variables can set serious challenges (e.g., convergence and/or computational challenges) in any statistical analysis. Also, the type of variables may vary, ranging from binary to numerical values. Such variation may create some restrictions with regard to the usage of certain algorithms.

In some embodiments of the current disclosure, the data selector 402 can be configured to reduce (or limit) the number of variables considered for generating models to reduce the complexity of the system and the complexity of the generated models. For example, the data selector 402 can select data variables representing indices (e.g., each defined based on multiple individual questions and describes a certain theme on a wider scope) rather than variables representing individual survey questions. The use of indices can decrease the number of variables in the model from about 500 to about 70 variables. In some implementations, the data selector 402 may select variables (e.g., related to individual survey questions) instead of the indices for model generation or model validation while employing the same processing methodology as in the case where the indices are used.

The model generator 404 can use the data subsets selected by the data selector 402 as training data to generate a model. The model generator 404 can select an algorithm from a plurality of algorithms stored in the library of modeling algorithms 406. The model generator 404 can execute the selected algorithm using data subsets selected by the data selector 402. The plurality of algorithms can include, for example, score-based learning algorithms (e.g., MDL scoring), the TABOO algorithm, the Tree Augmented Naïve Bayes (TAN), or other algorithms for identifying the structure of a model representing a set of data.

For example, the model generator 404 can use a version of the TABOO algorithm to generate a descriptive model or use the Tree Augmented Naïve Bayes (TAN), algorithm to generate a predictive model. Descriptive and predictive models can illustrate the dominant data variables (or dominant factors) and the dependencies between the data variables. A dominant data variable (also referred to as important factor/variable) can be a data variable that is a relatively strong predictor (e.g., compared to other data variables) for a target (e.g., academic performance or learning outcome for one or more students in one or more subjects). In other words, dominant data variables carry or reveal most of the information about a target.

Figure 5:
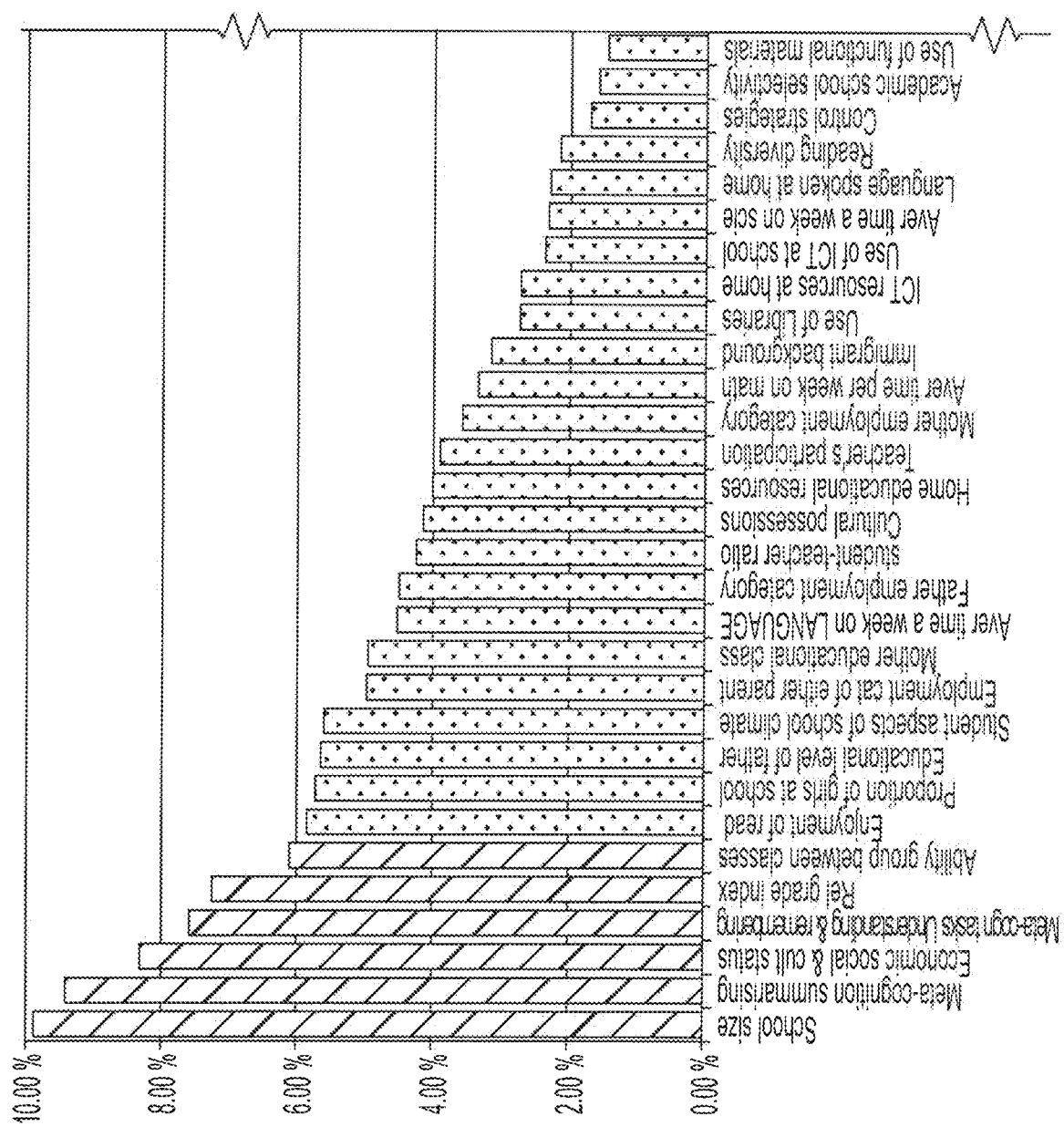
FIG. 5 shows a chart illustrating the strength or dominance of a plurality of variables with regard to predicting student learning outcome in science for Germany in 2009.
Figure 5:
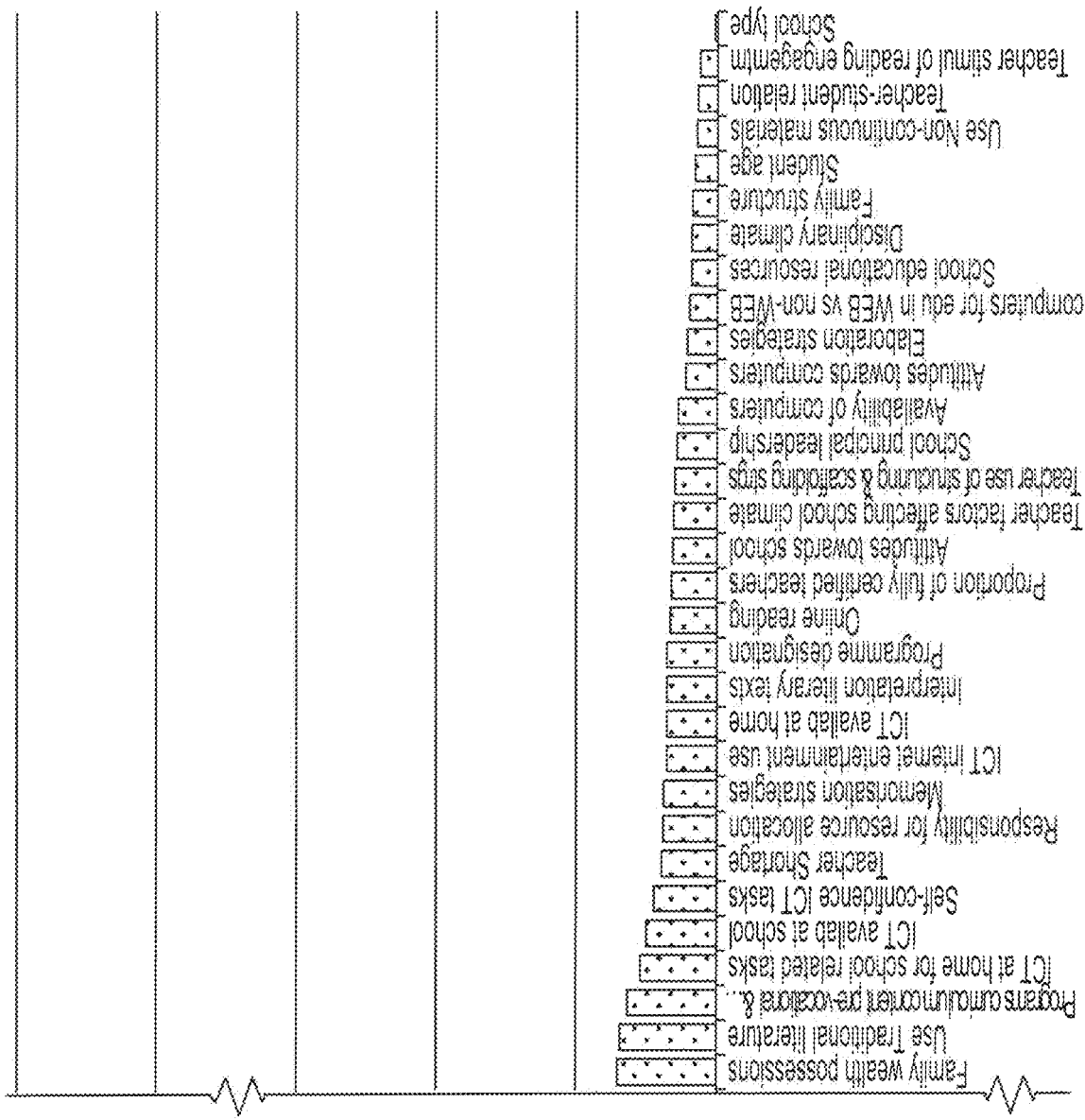

The model generator 404 can compute the strength in predicting a target (e.g., learning outcome) as a Pearson correlation between the predictor (e.g., a data variable), or as a Kullback-Leibler divergence. The Kullback-Leibler divergence can support nonlinear relationships. In most cases, the generated model can include a few strong predictors (or dominant data variables) and a long tail (or large number) of less strong predictors. The difference between dominant and non-dominant data variables is based on the dependency level as a Fullback-Leibler divergence value (e.g., compared to a threshold value of 6%). For example, when the value is more than 6%, the predictor (or data variable) can be considered as dominant. For example, FIG. 5 shows a chart illustrating the predicting strength (y-axis) of a plurality of variables (x-axis) with regard to student learning outcome in science for Germany in 2009. The model generator can use, for example, the levels 6% and above to identify the dominant variables, and the levels 2.5%-6% to identify useful variables.

The model generator 404 may employ a minimum description length (MDL) scoring based algorithm to generate descriptive models. Descriptive models generated by the analysis module 310 can be represented through visually comprehensible graphical objects (e.g., graphs) that help client device users to visualize and comprehend the most relevant attributes (variables) and their dependencies. For example, the graphical object can include a network graph including a plurality of nodes representing data variables associated with a predicting strength greater than or equal to a given threshold value (e.g., 2.5%) and edges representing dependencies between pairs of data variables. A descriptive model can be viewed as a generic dependency map that describes the relations between data variables and indicates visually to stakeholders (or users) the important (or dominant) variables (e.g., in terms of influencing academic performances) in the variable space. The descriptive models can provide the stakeholders with a quick view about important variables and their relationships and indicates potential paths to reach a variable B from a variable A.

The model generator 404 may employ a Tree Augmented Naive Bayes (TAN) algorithm to generate predictive models. The TAN algorithm relaxes the Naive Bayes attribute independence assumption by employing a tree structure, where each attribute only depends on the class and one other attribute. The model generator 404 can construct a predictive model, for example, based on the TAN algorithm for use to predict one or more targets. A target (e.g., performance or learning outcome either in mathematics, science or reading) can be predicted and explained based on dependencies with the other variables in the dataset.

The model validator 408 can validate the model generated by the model generator 404 using one or more test data subsets and one or more model performance metrics stored in one or more data files (or data structures) 410. The data selector 402 can select the test data subset(s) from data stored in the database 308 (similar to the selection of the training data subset(s) for generating the same model). The selected test data subset(s) can be different than the selected training data subsets used to generate the model. The model validator 408 can be configured to check the accuracy of the generated model using the test data and the performance metrics. The performance metrics can include, for example, error tolerance values. The model validator 408 can, for example, compare learning outcome output by the generated model to learning outcome values in the test data to check the accuracy of the generated model. Upon validating the generated model, the model validator 408 can store the validated model in library of validated models 312. The library of validated models 312 can store a plurality of models generated and validated by the analysis module 310.

Referring back to FIG. 3, the analysis module 310 can generate a plurality of models in a similar way described with regard to FIG. 4 and store these models in library of validated models 312. The plurality of models can be generated based on different subsets of training data and validated using different subsets of test data. The plurality of models can be associated with different student populations (e.g., associated with a class, a grade level in a school, a school, school district, a state, or a country), different subjects (e.g., math, science, English, etc.), or other aspects of education systems. The analysis module can be configured to generate one or more models responsive to one or more requests from client devices 102 (e.g., associated with a superintendent, a principal, or a teacher).

Responsive to a request from a client device 102 (e.g., a request to predict or compute a learning outcome or a performance metric associated with the education process), the simulator 314 can select a model from the plurality of models stored in the library of validated models 312. The simulator 314 can select the model based on an indication of a selected model, a selected subject, a selected student population, or a combination thereof, in the request received from the client device 102. The simulator 314 can also select a data subset (e.g., SIS data, data received from one or more teachers, data from a one or more schools, data from a school district, etc.) from the database 308. The simulator 314 can used the selected data subset and the selected model to compute the performance metric (e.g., a learning outcome). The simulator 314 can be configured to simulate a specific model on a regular basis based on, for example, data (e.g., lesson planning data, teacher feedback or teacher notes dates, or other data) received regularly from client devices 102. As such, the EI system 300 can allow monitoring the performance of the education process as it progresses. For example, the EI system (or EDLIGO) can provide estimates or predictions of students' performance(s) in mathematics, science or reading throughout a life cycle of the education process.

The output model 316 can be configured to provide the computed performance metric for display on the client device(s) 102. The output model 316 can also provide other data, such as data collected and stored in the database 308, for display on client devices 102. The output module 315 can provide graphical representations of generated models or other data for display on client devices 102.

Figure 6:
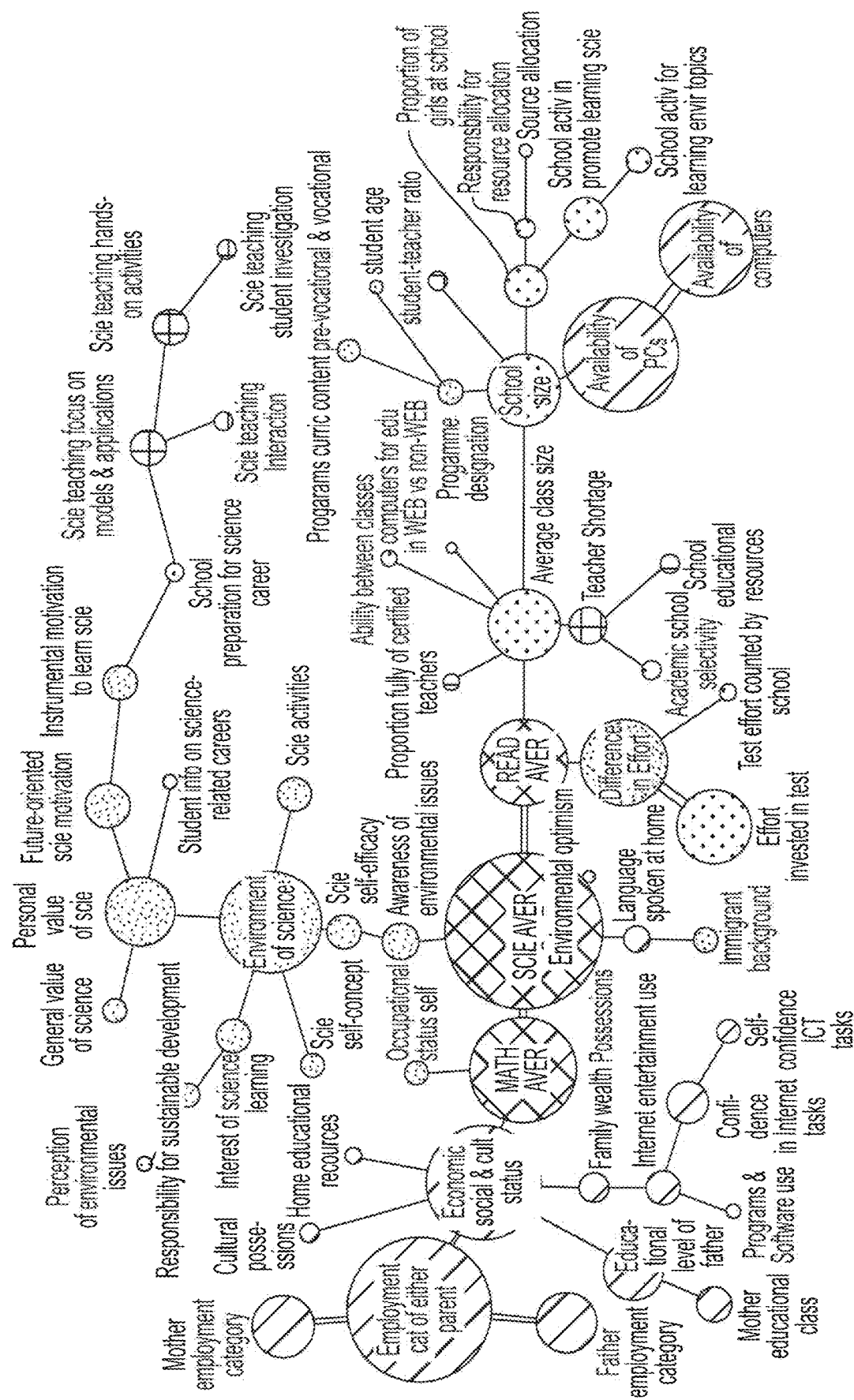
FIG. 6 shows a Bayesian network model generated by the EI system in FIG. 3, according to one or more embodiments.

FIG. 6 shows a Bayesian network model generated by the EI system 300, according to one or more embodiments. The Bayesian network model can include a plurality of nodes (shown as circles in FIG. 6) with pairs of nodes connected via edges. The nodes represent the data variables. The size of each node represents the dominance of the respective variable, whereas the color of the node represents a category of the respective variable. The bigger the circle, the more dominant is the corresponding data variable. The edges between pairs of nodes represent the dependencies between corresponding pairs of data variables. For example, the edges can be indicative of a causality relationship between different data variables (or factors). The analysis module 310 can estimate causality between any pair of data variables based on the conditional probability between that pair of data variables.

Bayesian networks can unveil dependencies between data variables (e.g., representing learning attributes or other attributes) which act as predictors of student performance, for example, in mathematics, science or reading. A real word education system can be a very complex multilayer environment that is difficult to model by accounting for all the factors affecting to learning outcome. The models generated by the EI system 300, such as the Bayesian network shown in FIG. 6, can provide a summary view for stakeholders (e.g., superintendents, principals, teachers, or other people involved in education) indicative of the dominant or important factors and the most relevant and important dependencies between various factors or attributes. The EI system 300 can also generate other types of models, such as directed acyclic graph models, neural network models or convolutional network models.

Figure 7:
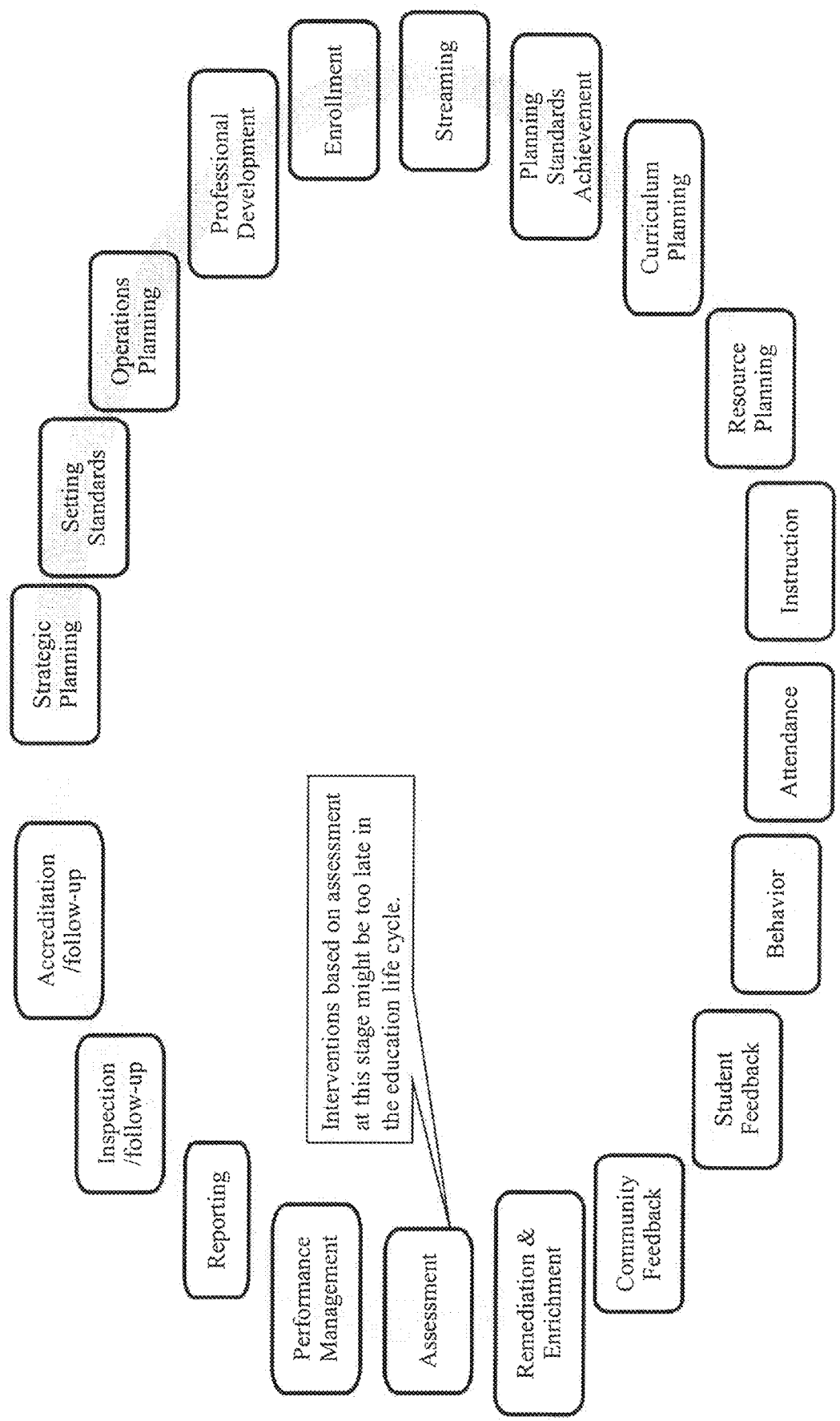
FIG. 7 shows a diagram illustrating various stages in a life cycle of an education process.

FIG. 7 shows a diagram illustrating various stages in a life cycle of an education process. Such stages can start, for example, with "strategic planning (e.g., at a school district level, state level, or country level), and can include stages such as "professional development," "planning standard achievement," "curriculum (or lesson) planning," "assessment," and "reporting." The education instrumentation platform (e.g., as shown in FIG. 3) can provide one or more client applications running on client devices 102 to interact with the EI system 300. The one or more client applications can provide a plurality of user interfaces (UIs) associated with the plurality of stages of the life cycle shown in FIG. 7. As such, users of the client devices 102 can monitor the progress of the education process throughout the life cycle.

The client application(s) and the UIs provided on each client device 102 can vary based on, for example, the respective user profile. For example, the client application or the UIs available to a teacher may be different than those available to a super intendent or a principal.

Figure 8A:
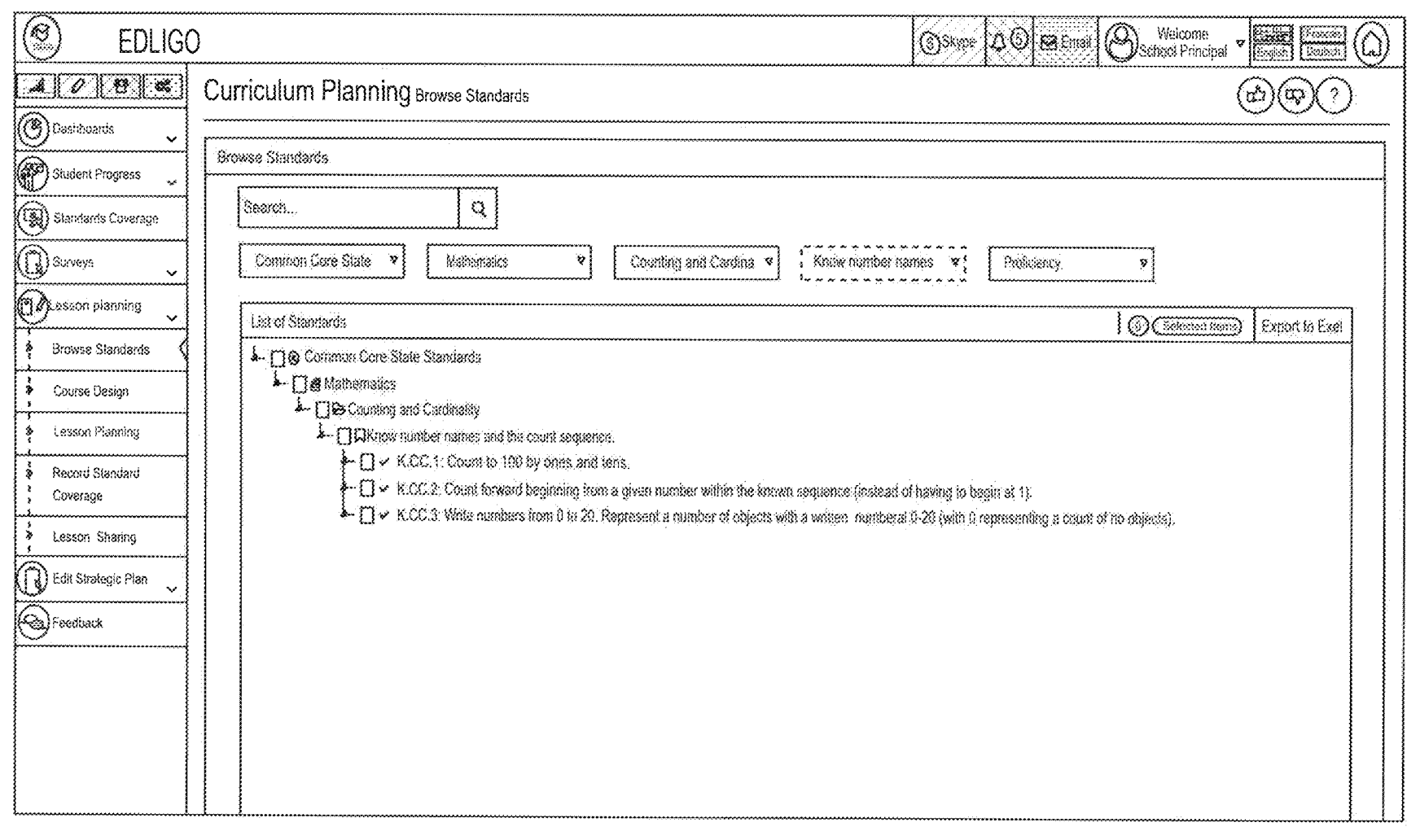
Figure 8B:
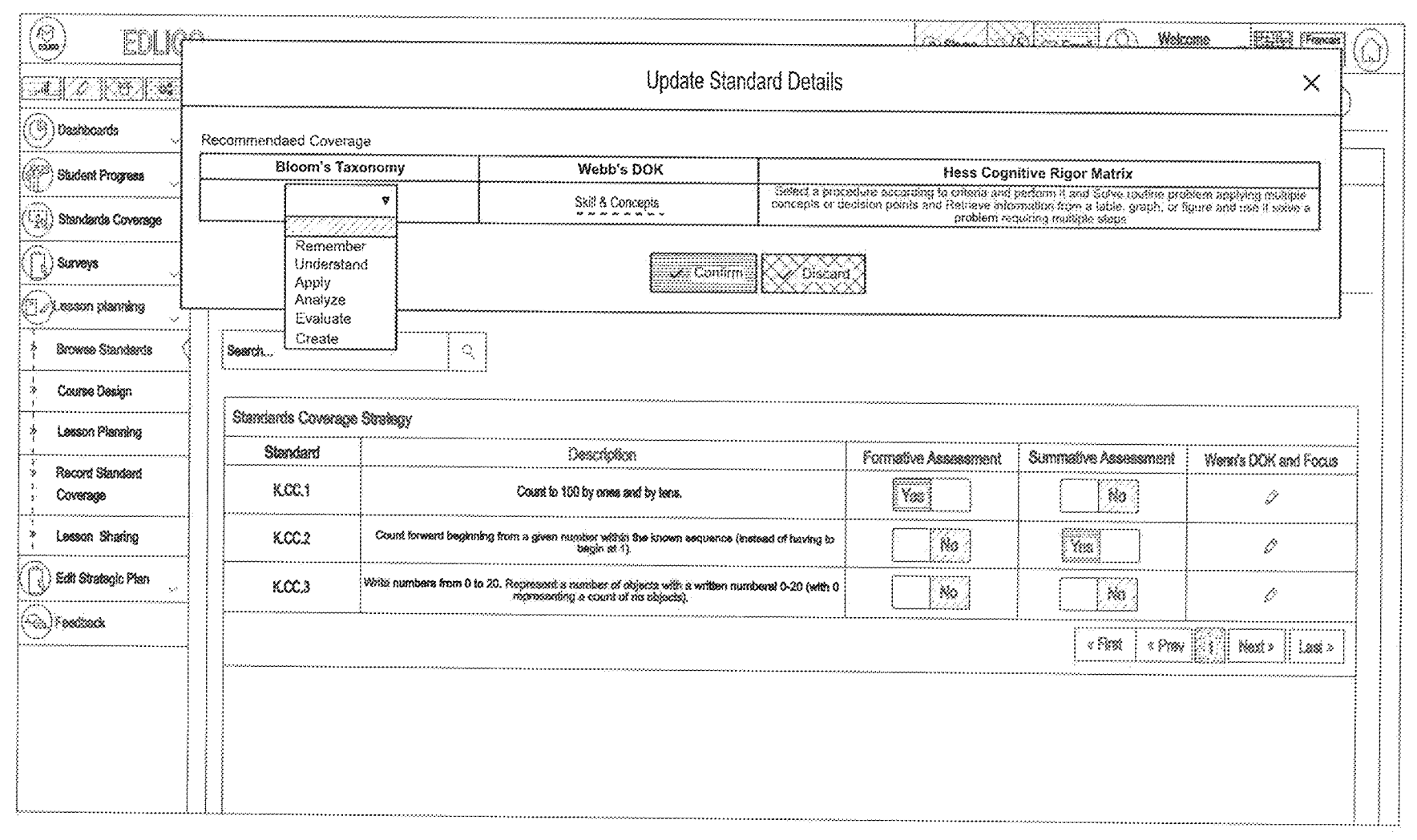
Figure 8C:
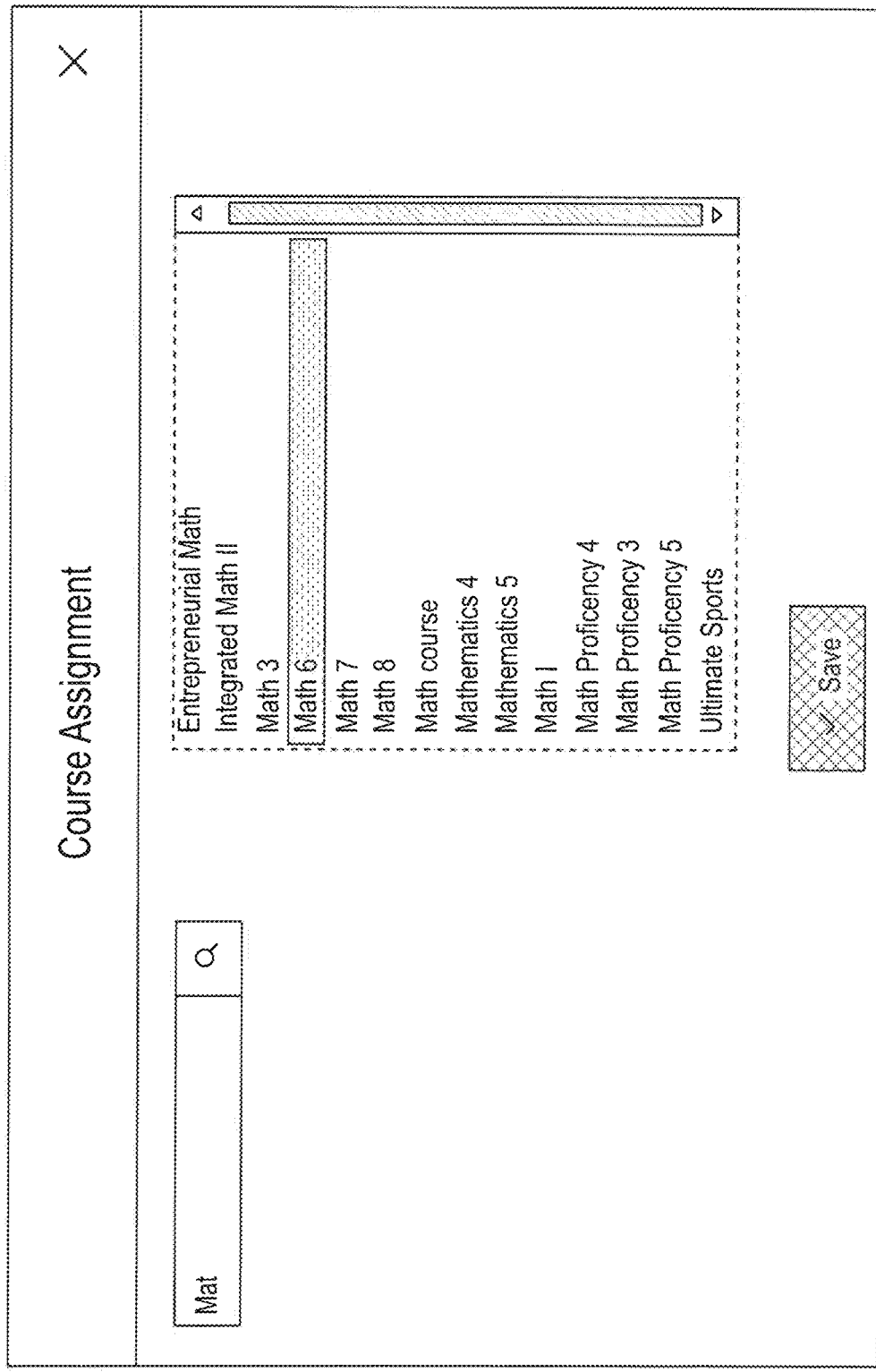
Figure 8D:
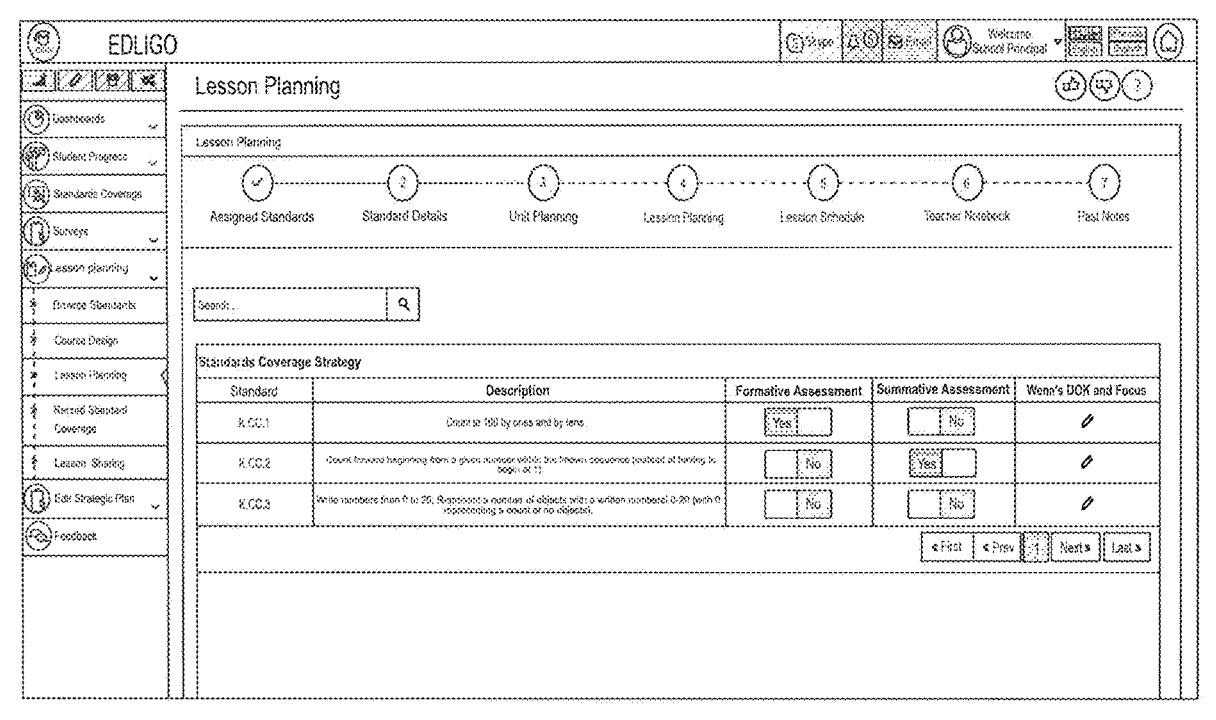
Figure 8E:
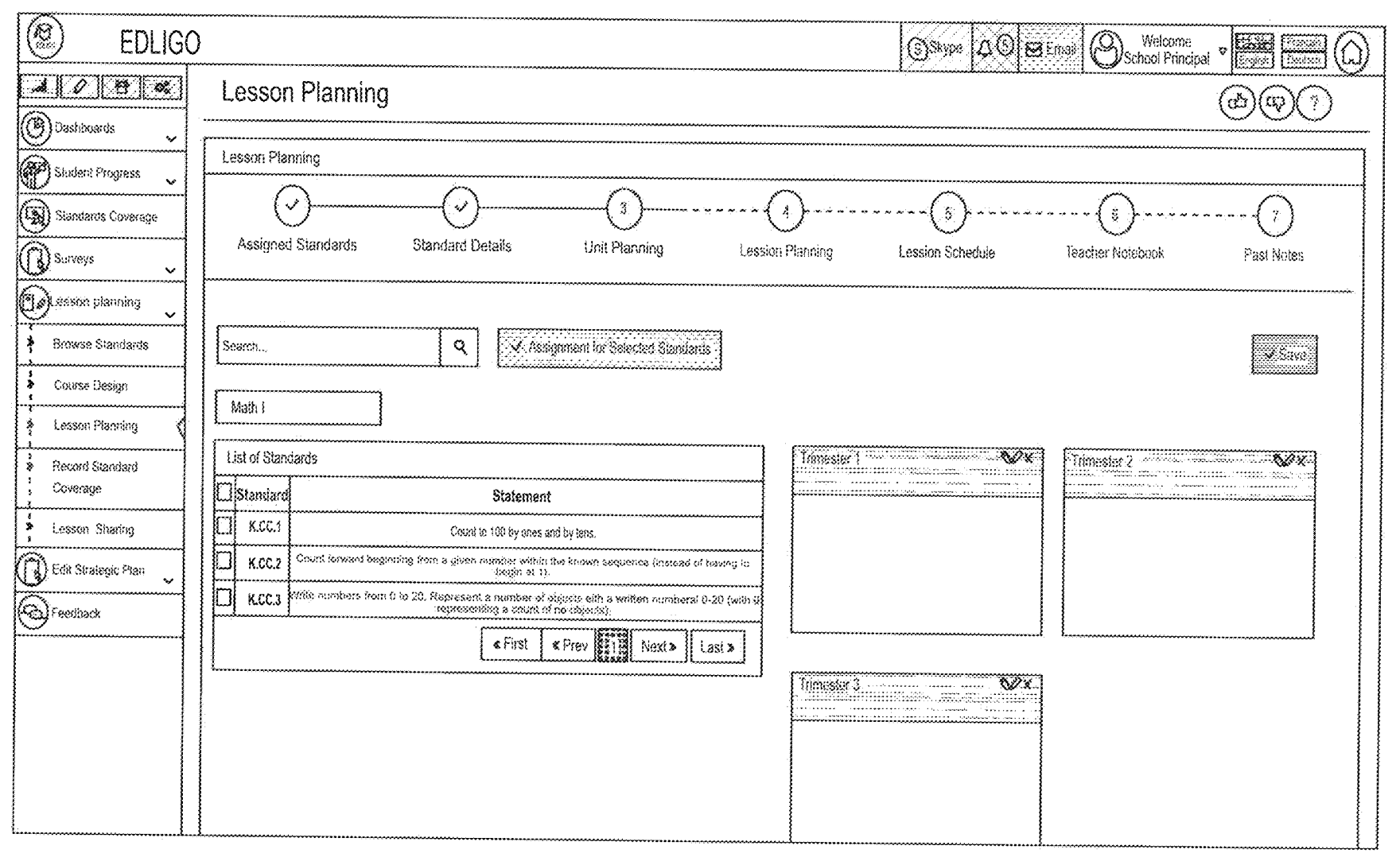

FIGS. 8A-E and 8B show various UIs associated with the curriculum (or lesson) planning stage. The UI in FIG. 8A allows a user to select one or more education standards among a plurality of standards (e.g., Common Core State Standards). The UI in FIG. 8A allows a user to select one or more education standards among a plurality of standards (e.g., Common Core State Standards). Each standard can include one or more collections of standard elements indicative of, for example, mastery levels expressed in terms of a taxonomy (e.g., Bloom's taxonomy or Webb's taxonomy). FIG. 8B shows a UI for selecting a mastery level (e.g., remember, understand, apply, analyze, evaluate, or create) for a selected standard. The mastery level can be indicative of what the student is expected to master with regard to a specific subject. FIG. 8C shows a UI for selecting course or subject to which the selected standard and/or the selected mastery level is to be applied. FIG. 8D shows a UI for selecting a type of assessment to be applied with regard to a selected course or subject, and FIG. 8D shows a UI for selecting a time frame by which the selected mastery level(s) is to be achieved.

Figure 9:
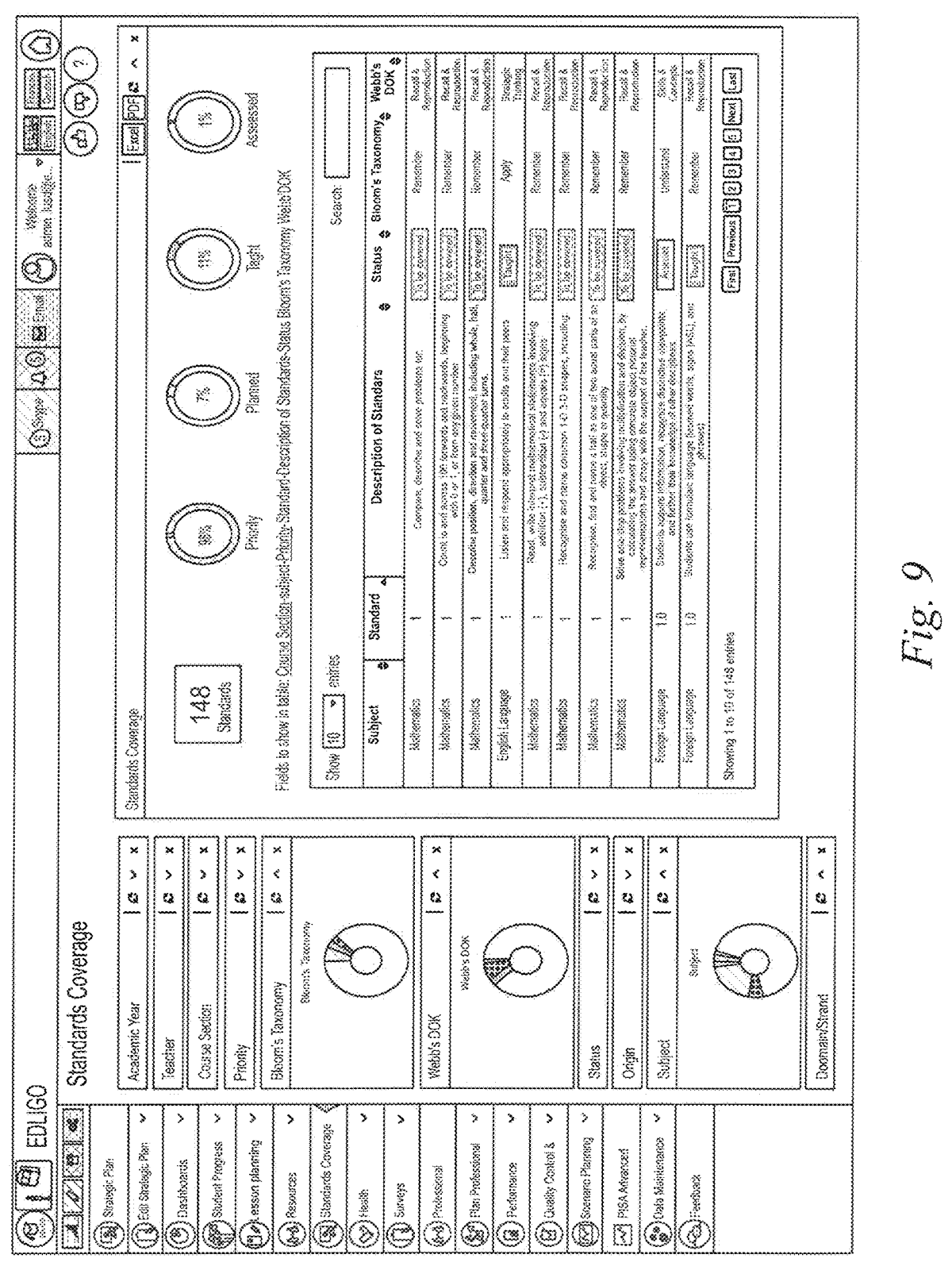

FIG. 9 shows a UI associated with the instruction stage of the life cycle in FIG. 7. In particular, the UI in FIG. 9 shows data and charts indicative of progress in addressing selected standards through instructions (e.g., teaching) and assessment.

Figure 10A:
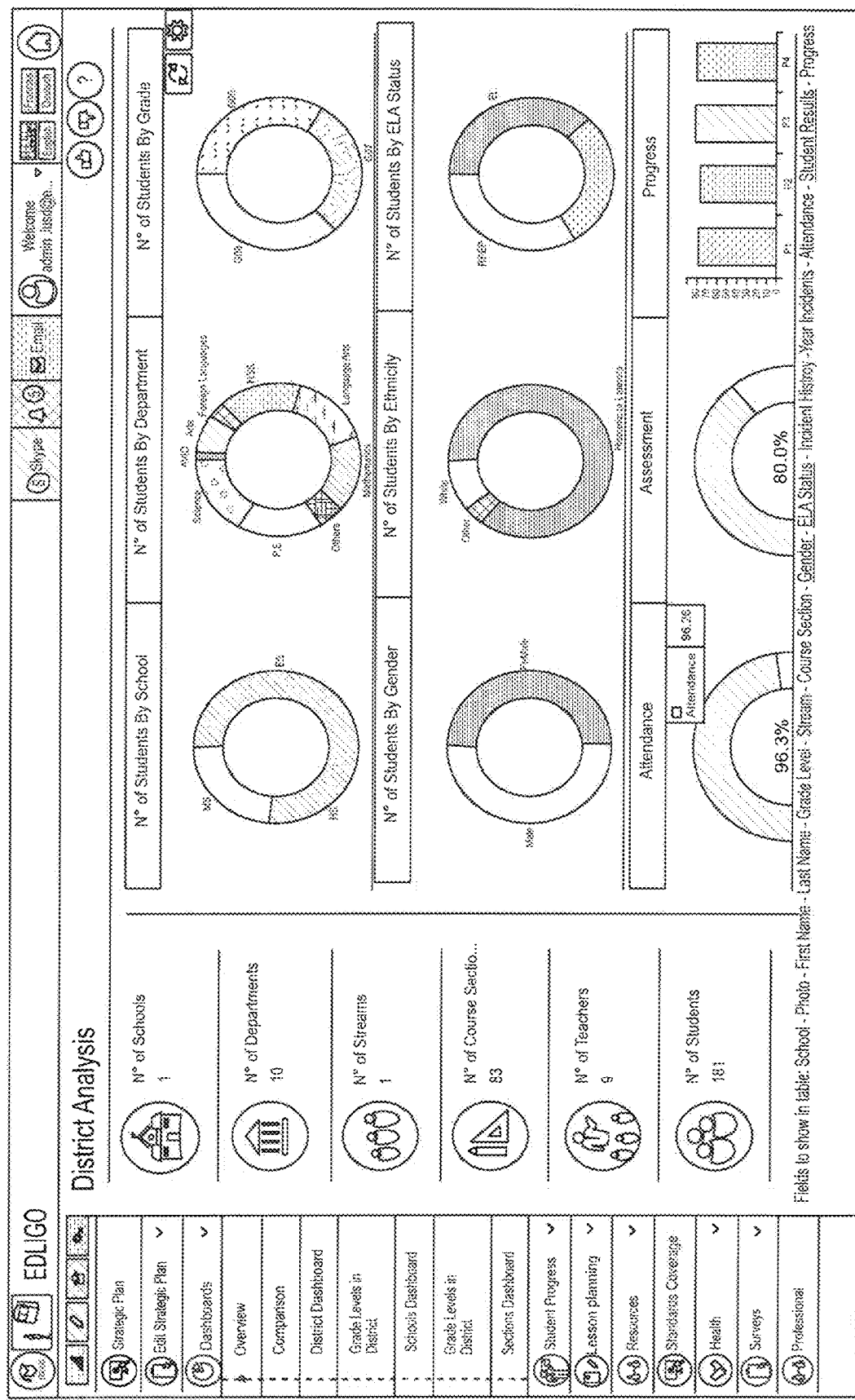
FIGS. 10A-C show various UIs associated with the reporting stage of the life cycle in FIG. 7.
Figure 10B:
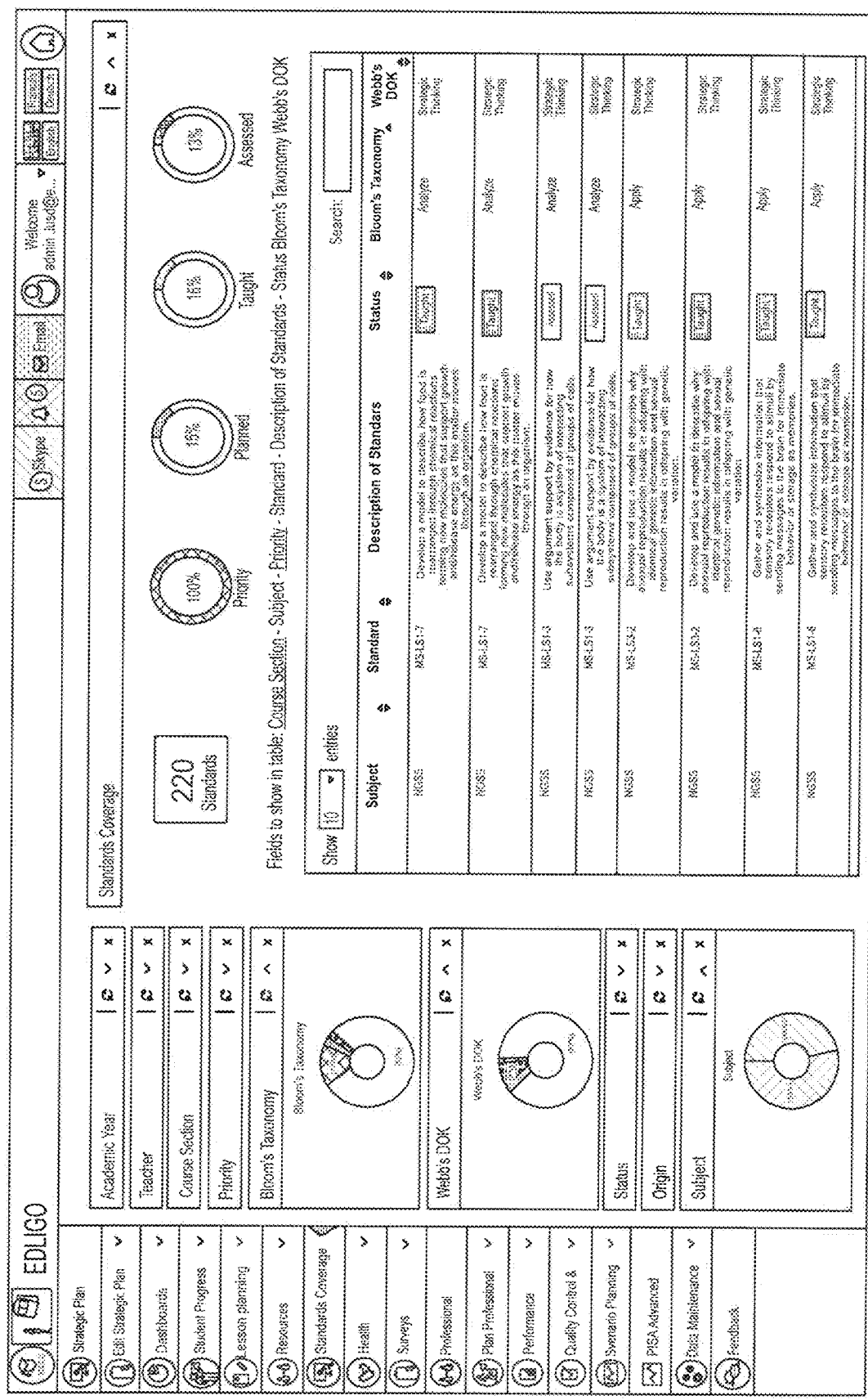
Figure 10C:
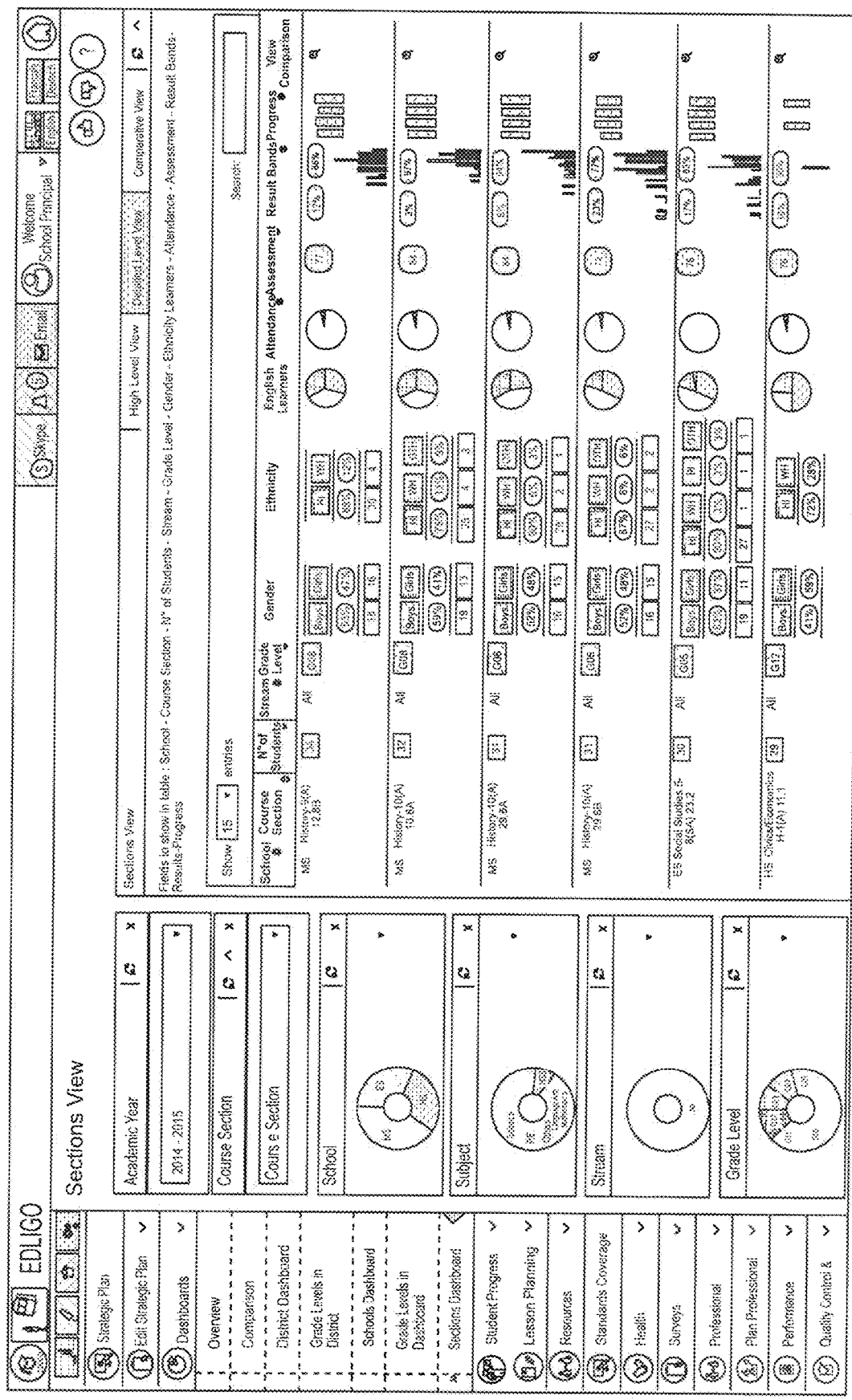

FIGS. 10A-C show various UIs associated with the reporting stage of the life cycle in FIG. 7. For example, the UI in FIG. 10A shows performance of a school district. The UI in FIG. 10B shows standard coverage. The UI in FIG. 10B can also be part of the instruction stage to allow tracking of standards' coverage in the middle of the life cycle. The UI in FIG. 10C shows students' performances in various subjects.

Besides predicting or estimating learning outcomes, the EI system 30 can generate and provide recommendations (e.g., for teachers, principals, or superintendents) to plan or adjust an education process. For example, the simulator 314 can use a one or more validated models and one or more data subsets selected from the database 308 to simulate various scenarios (e.g., based on different standards, different mastery levels, or variations of other attributes). The simulator 314 can compare learning outcomes associated with the various scenarios and provide a recommendation indicative of the best performing scenario. In some implementations, the EI system 30 can provide the comparison of the various scenarios for display on one or more client devices 102.

The education instrumentation platform described herein allows leaders, e.g. district superintendents (or employees) to track curriculum coverage at the district level (or at finer levels such as school level, grade level or class/teacher level) through a curriculum coverage UI (e.g., as shown in FIG. 10B). The education instrumentation platform can also provide leaders/employees with real-time visibility and insights of the education processes (such as lesson planning, instruction assessment, educational and school resources, student/community engagement, teacher and/or staff professional development, etc.) in the respective area in responsibility (e.g. a district). The education instrumentation platform can also allow leaders/employees to monitor and/or enforce alignment of educational programs in the district to state and/or country objectives. The education instrumentation platform can also allow leaders/employees to set focused actions, for instance, to be implemented or executed by principals, teachers or school staff and administrators.

For state leaders, the education instrumentation platform can provide UIs for presenting information indicative of global competitiveness analysis of the education system and real-time insights of the education processes. The UIs can allow state leaders to address the root causes impacting performance and systematic governance by, for instance, inputting, modifying or deleting instructions or guidelines to be implemented by school districts, schools, principals, teachers, school staff, or a combination thereof.

The education instrumentation platform can also allow for personalizing teaching or learning techniques for various students or groups of students. The personalization of teaching or learning techniques can be implemented through the analysis module 310 and the simulator 314, which based on observations simulations of various scenarios can recommend to students, teachers, faculty, administrators and policy makers various interventions including (1) predicting student future performance at each subject skill and sub-skill based on previous and current performance(s), recommending content suitable for students based on analysis of previously covered content and corresponding standards, (3) guiding students in selections of subjects and electives to achieve optimum future results, (4) designing what to assess to accurately evaluate students' performance and the type of assessment required, (5) recommending how learning can be individualized for more effective learning experiences, (6) analyzing how students proceed through a course (pace of learning, motivation, level of interest and engagement), (7) predicting students future orientation and hence motivation, (8) recommending new and alternative learning opportunities and different courses to students, (9) analyzing undesirable learning behaviors, and detect affective states (e.g., boredom, frustration) of the learner, (10) predicting attrition likelihood related to courses or programs, (11) predicting student grades and the factors that influence the performance of the students, (12) recommending what material and human resources will be needed over a course of time, or (13) predicting how objectives are to be met.

The EI system 300 can provide real-time analysis results by feeding recent (or new) data to one or more generated and validated models. The EI system 300 can provide interactive analysis results by enabling the validated models to be used by students, teachers and policy makers for their what-if-analysis. The EI system 300 can provide reports, scenario modelling results, and/or prediction results.

Outcomes in education are often equated to assessment results. Often organization define action plans on the basis of assessment results, usually at the end of the life cycle, of the education process. Whereas such assessment is important, it comes late in the life cycle. The challenge becomes is then how to understand well ahead of the assessment results, how students are expected/predicted to perform. The education instrumentation platform described herein is can employ an information theory paradigm of information loss between sender and receiver. In every stage of the life cycle depicted on the diagram in FIG. 7, there is certain likelihood that information can get lost. For example, if a student is absent 50% of the time, we can approximate information that was received at student end (receiver) is only 50% of what the teacher intended to broadcast (in the form of lesson). When considering all items ahead of assessment in the cycle, one can approximate the information received at student Ireceived end as a function of all the operations/steps before. Ireceived is an appropriate approximation of the expected outcomes the student is going to score during assessment. To the best of our knowledge, such comprehensive definition and approximation together with the visualization of its results has never been addressed in previous works.

As an example, consider a first scenario where a teacher plans lessons for 100% of the curriculum, the teacher delivers lessons for 100% of the curriculum, a student attends 100% of the lessons, and the student is well behaving 100%. Then we can assume that the student received 100% of the planned curriculum. In a second scenario, a teacher plans lessons for 80% of the curriculum (e.g. missed to cover 10 common core standards out of 50), the teacher delivers lessons for 80% of the curriculum (was absent 20% of the time and there was no replacement), a student attends 90% of the lessons, and the student is well behaving 50% (not attentive, playing in classroom). Then we can assume that the student received the multiplication of all above; e.g., 28.8% of the planned curriculum.

If Itarget: denotes the information, skills, competences, and/or learning outcomes which the governing body (e.g. State Department of Education) expects students to master at a certain mastery level, by a certain point in time (e.g. by end of Grade 10) or within one semester of study of a particular subject, Itarget: can be expressed, for example, using three variables Itarget1, Itarget2, and Itarget3. Itarget1 can represent the standards and, in general, the information, skills, competences, and/or learning outcomes which the governing body (e.g. State Department of Education) expects students to master. Itarget2 can represent the level(s) of mastery of the items defined in Itarget1. The level(s) of mastery can be expressed as a percentage number (e.g. 75%), as a level in a defined taxonomy (e.g., we may expect the students to master a Common Core standard at Webb's Degree of Knowledge Level 3, Strategic Thinking/Reasoning, or at Revised Bloom's Taxonomy Level "Apply"), or as a combination thereof (e.g., as a 2-tuple of Webb's and Bloom's taxonomies (Strategic Thinking/Reasoning, Apply). Itarget3 can define the timeframe by which the mastery is expected, in absolute or relative form. Itarget can be referred to as the curriculum.

Let X1 denote the mastery level of Itarget1 (e.g., of information, skills, competences, and/or learning outcomes) which the teachers possess, as a function of their academic qualifications, professional qualifications, professional development trainings they attended successfully, skills acquired through self-learning, or through feedback (e.g., from inspectors, leaders, peers, students, community, etc.). Let X2 be the level of coverage of the standards (Itarget1) at the expected level (Itarget2) in the lesson planning through appropriate units, lessons, learning objectives and tasks. In other words, how far do the lesson plans cover the required curriculum defined by Itarget1 and Itarget2 to be achieved by Itarget3. Let X3 be the degree to which what was planned in X2 (lesson planning) is covered/addressed through instruction and other teaching methods (e.g. project work). This can be expressed as percentage of X2 or other more general function of X2 (frequency of coverage of a given item of Itarget1). Let X4 be the attendance rate of a student (e.g. 90% attendance rate). Let X5 be the discipline (expressed in percentage) of a student (e.g. only half of the time attentive and engaged, then 50%). Let X6 be student feedback (expressed as a percentage of e.g. favorable responses), and X7 be the additional remedial or enrichment activities performed by the student (e.g., extra curriculum activities/courses).

Ireceived can be defined as the approximated information which was really received at the student end and is expressed by three variables Ireceived1, Ireceived2, and Ireceived3. Based on the data points Itarget, X1 to X7, the education instrumentation platform can apply one or a combination of one or more processes to approximate Ireceived. The one or more processes can include process 1, which can be a deterministic algorithm, and process 2, which can include a machine learning process, which uses previously (e.g. from past terms or years) recorded values of Itarget, X1 to X7 and Ireceived to learn how to predict Ireceived from Itarget and X1 to X7. The EI system 300 can use the trained model to predict Ireceived then based on new observations of Itarget and X1 to X7

According to Process 1, (Ireceived) can be calculated from the values of Itarget and X1 to X7 and is expressed as a function such as Ireceived=Itarget×(X1×X2×X3×X4×X5×X6)+X7. A more general function applying weighting factors to each of X1 to X9 to emphasize the one or other factor can be used such as Ireceived=(wtarget·Itarget)×(w1·X1×w2·X2×w3·X3×w4·X4×w5·X5×w6·X6)+w7·X7. Other general mathematical function taking as parameter Itarget and X1 to X7, i.e. a function f (Itarget, X1, ..., X7) can also be employed.

Process 2 can include three steps; discovery phase, a learning phase, and a prediction step. In the discovery phase, the EI system 300 can use score based algorithms to understand the dependencies between the different data points (expressed for example as dependency map). In the learning phase, the EI system 300 can train a machine learning model to predict Ireceived from Itarget and X1 to X7. In the prediction phase, the EI system 300 can predict Ireceived from a new set of recorded Itarget and X1 to X7.

Figure 11:
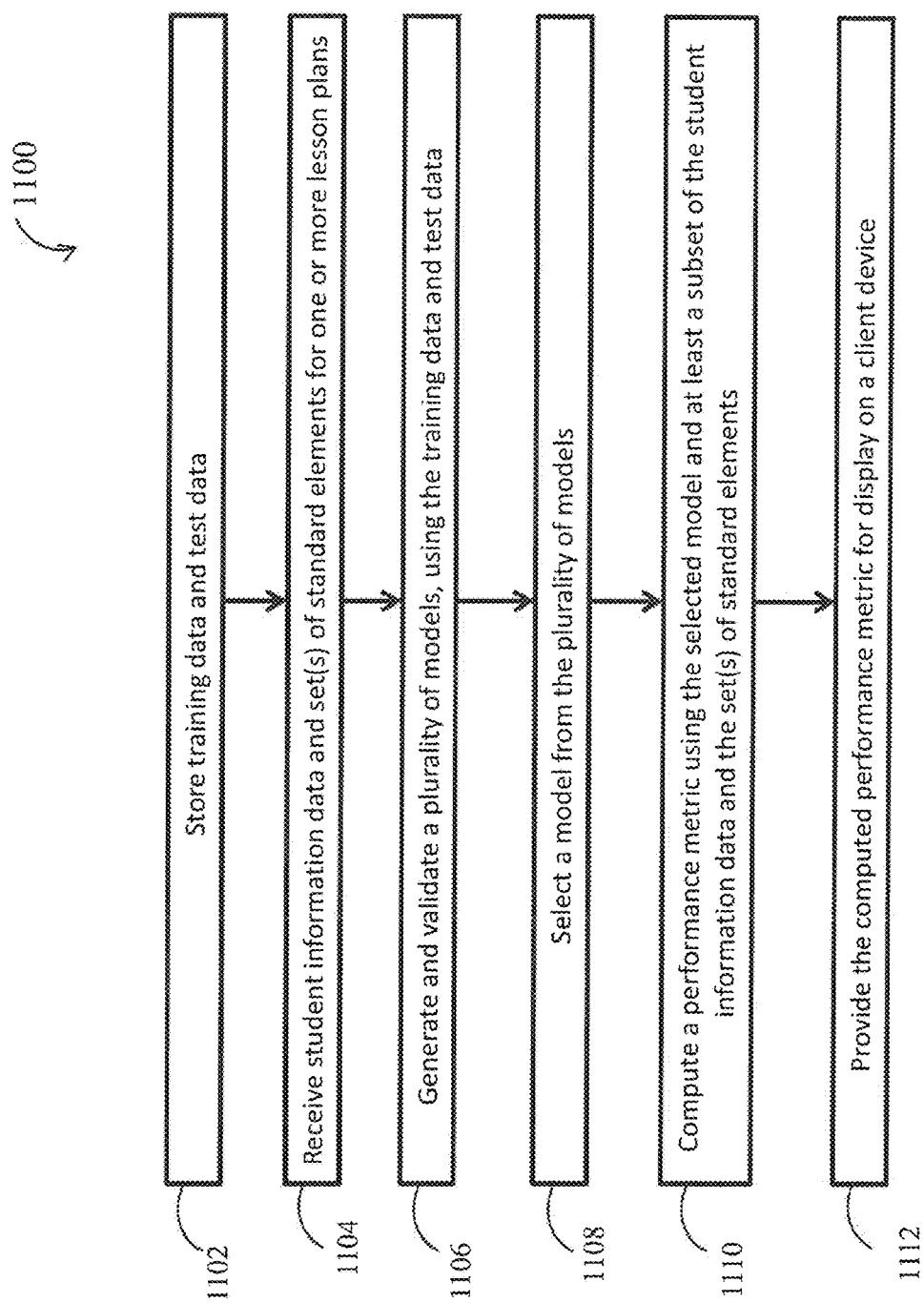
FIG. 11 shows a flowchart of a method for computing performance metrics of education processes.

FIG. 11 shows a flowchart of a method 1100 for computing performance metrics of education processes. The method 1100 can include storing, by one or more processors, training data and test data in a database (step 1102). The training data and the test data can be related to student academic performance of a first plurality of students. The one or more processors can receive student information data for a second plurality of students from a student information system (SIS), and receive, from one or more client devices, one or more sets of standard elements for one or more lesson plans selected via a first user interface associated with the one or more client devices (step 1104). The first user interface including lesson planning templates for selection of standard elements for lesson planning. The one or more processors can generate, using the training data, a plurality of models to simulate performance of an education process, and validate the plurality of models using the test data (step 1106). The one or more processors can select a model from the plurality of models based on a selection by a client device of a student population among the second plurality of students (step 1108). The one or more processors can compute a performance metric using the selected model and at least a subset of the student information data and the one or more sets of standard elements (step 1110). The one or more processors can provide the computed performance metric for display on the client device via a second user interface of the plurality of user interfaces (1112).

The steps of the method 1100 can be carried out by the EI system 300 as described above with regard to FIGS. 3-10C.

With regard to Itarget2 (e.g., the level of mastery of the standards and in general skills, competences, and/or learning outcomes which the governing body expects students to master), in order to precisely understand the attained degree of mastery for each standard, the standard is deconstructed and various levels of mastery are defined at sub-item level (e.g., building a hierarchy: start at atomic level and then aggregate), as described, for example, with regard to FIGS. 8A and 8B. For each of the sub-items, the EI system 300 can apply process 1 and/or process 2.

When an assessment (test) gets designed, it is possible to understand and measure whether the assessment elements (e.g. quiz, exercises) called Y1, Y2, . . . Yn are effectively assessing what the student received Ireceived and at which mastery level. In other words, it is possible to build a gap analysis between whether Y1, Y2, . . . Yn are aligned to Itarget and what the students actually received and expressed as Ireceived. Further, the assessment results of Y1, Y2, . . . Yn to further tune the model and processes 1 and 2 outlined above. Given that a student/learner targets reflect also progress over time and assessments are conducted over a period of time, multiple times, and in various forms (e.g. diagnostic, formative, summative), a time series of the targets, measurements, and outcomes are analyzed using time series analysis techniques (longitudinal analysis, repetitive in time) can be generated by the system.

While the invention has been particularly shown and described with reference to specific embodiments, it should be understood by those skilled in the art that various changes in form and detail may be made therein without departing from the spirit and scope of the invention described in this disclosure.

While this specification contains many specific embodiment details, these should not be construed as limitations on the scope of any inventions or of what may be claimed, but rather as descriptions of features specific to particular embodiments of particular inventions. Certain features described in this specification in the context of separate embodiments can also be implemented in combination in a single embodiment. Conversely, various features described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated in a single software product or packaged into multiple software products.

References to "or" may be construed as inclusive so that any terms described using "or" may indicate any of a single, more than one, and all of the described terms.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain embodiments, multitasking and parallel processing may be advantageous.

What is claimed is:

1. A system comprising:
one or more processors; and
a memory storing computer code instructions, which when executed by the one or more processors, cause the one or more processors to:
obtain via one or more application programming interfaces (APIs) training data and test data related to student performance for a first plurality of students from one or more student information systems (SISs), the training data and the test data associated with a plurality of variables having influence on performance of an education process;
select one or more subsets of data from the training data to reduce a number of the plurality of variables to use for generating machine learning models, the one or more subsets of data representing one or more indices based at least on one or more individual questions and describing a theme;
generate, using the one or more subsets of data, a plurality of machine learning models to simulate the performance of the education process to predict a performance outcome of a student based at least on information received by the plurality of students identified by the one or more subsets of data, each machine learning model of the plurality of machine learning models translated into graphical representations: (i) representing a network of a respective subset of variables of the plurality of variables for simulating the performance of the education process, and (ii) illustrating for each variable of the plurality of variables a respective strength of predicting the performance of the education process;
validate the plurality of machine learning models using the test data;
simulate, using at least a subset of the plurality of machine learning models, a plurality of scenarios of the education process, simulating each scenario of the plurality of scenarios includes determining a respective performance metric of the education process;
display a comparison of respective performance metrics of the education process for the plurality of scenarios; and
provide a recommendation, based on the comparison, one or more action plans related to at least one stage of a plurality of stages of the education process.

2. The system of claim 1, wherein the at least one stage of the plurality of stages of the education process includes a teacher or staff professional development stage.

3. The system of claim 1, wherein the at least one stage of the plurality of stages of the education process includes at least one of:
a curriculum or course planning stage; or
a resource planning stage.

4. The system of claim 1, wherein the at least one stage of the plurality of stages of the education process includes at least one of:
an assessment stage; or
a performance management stage.

5. The system of claim 1, wherein the at least one stage of the plurality of stages of the education process includes a remediation and enrichment stage.

6. The system of claim 1, wherein the one or more action plans include one or more actions to be implemented or executed by a superintendent, principal, teacher or school staff member.

7. The system of claim 1, wherein the computer code instructions, when executed by the one or more processors, further cause the one or more processors to provide a recommendation indicative of a best performing scenario, among the plurality of scenarios.

8. The system of claim 1, wherein the computer code instructions, when executed by the one or more processors, further cause the one or more processors to cause display of data indicative of the comparison of the respective performance metrics of the education process for the plurality of scenarios.

9. The system of claim 1, wherein the training data and the test data include at least one of:
   Program for International Student Assessment (PISA) data;
   Trends in International Mathematics and Science Study (TIMSS) data;
   National Assessment Program (NAP) data
   Progress in International Reading Literacy Study (PIRLS) data;
   Smarter Balanced Assessment Consortium data;
   student information data;
   class or grade information data;
   resources information data;
   educational applications information data;
   school facilities information data;
   data related to qualifications, skills, professional development or paygrades of principals, teachers, or staff associated with one or more schools; or
   budgeting and expenditure information data for one or more schools.

10. The system of claim 1, wherein the plurality of machine learning models includes at least one of:
    a Bayesian network model;
    a directed acyclic graph model;
    a neural network model; or
    a convolutional neural network model.

11. A method comprising:
    obtaining via one or more application programming interfaces (APIs) training data and test data related to student performance for a first plurality of students from one or more student information systems (SISs), the training data and the test data associated with a plurality of variables having influence on performance of an education process;
    select one or more subsets of data from the training data to reduce a number of the plurality of variables to use for generating machine learning models, the one or more subsets of data representing one or more indices based at least on one or more individual questions and describing a theme;
    generating, using one or more subsets of data, a plurality of machine learning models to simulate the performance of the education process to predict a performance outcome of a student based at least on information received by the plurality of students identified by the one or more subsets of data, each machine learning model of the plurality of machine learning models translated into graphical representations: (i) representing a network of a respective subset of variables of the plurality of variables for simulating the performance of the education process, and (ii) illustrating for each variable of the plurality of variables a respective strength of predicting the performance of the education process;
    validating the plurality of machine learning models using the test data;
    simulating, using at least a subset of the plurality of machine learning models, a plurality of scenarios of the education process, simulating each scenario of the plurality of scenarios includes determining a respective performance metric of the education process;
    display a comparison of respective performance metrics of the education process for the plurality of scenarios; and
    providing a recommendation, based on the comparison, one or more action plans related to at least one stage of a plurality of stages of the education process.

12. The method of claim 11, wherein the at least one stage of the plurality of stages of the education process includes a teacher or staff professional development stage.

13. The method of claim 11, wherein the at least one stage of the plurality of stages of the education process includes at least one of:
    a curriculum or course planning stage; or
    a resource planning stage.

14. The method of claim 11, wherein the at least one stage of the plurality of stages of the education process includes at least one of:
    an assessment stage; or
    a performance management stage.

15. The method of claim 11, wherein the at least one stage of the plurality of stages of the education process includes a remediation and enrichment stage.

16. The method of claim 11, wherein the one or more action plans include one or more actions to be implemented or executed by a superintendent, principal, teacher or school staff member.

17. The method of claim 11, further comprises at least one of:
    providing a recommendation indicative of a best performing scenario among the plurality of scenarios; or
    causing display of data indicative of the comparison of the respective performance metrics of the education process for the plurality of scenarios.

18. The method of claim 11, wherein the training data and the test data include at least one of:
    Program for International Student Assessment (PISA) data;
    Trends in International Mathematics and Science Study (TIMSS) data;
    National Assessment Program (NAP) data
    Progress in International Reading Literacy Study (PIRLS) data; or
    Smarter Balanced Assessment Consortium data,
    student information data;
    class or grade information data;
    resources information data;
    educational applications information data;
    school facilities information data;
    data related to qualifications, skills, professional development or paygrades of principals, teachers, or staff associated with one or more schools; or
    budgeting and expenditure information data for one or more schools.

19. The method of claim 11, wherein the plurality of machine learning models includes at least one of:
- a Bayesian network model;
- a directed acyclic graph model;
- a neural network model; or
- a convolutional neural network model.

20. A non-transitory computer-readable product including computer code instructions stored thereon, the computer-code instructions, when executed by one or more processors, cause the one or more processors to:
- obtain via one or more application programming interfaces (APIs) training data and test data related to student performance for a first plurality of students from one or more student information systems (SISs), the training data and the test data associated with a plurality of variables having influence on performance of an education process;
    - select one or more subsets of data from the training data to reduce a number of the plurality of variables to use for generating machine learning models, the one or more subsets of data representing one or more indices based at least on one or more individual questions and describing a theme;
- generate, using the one or more subsets of data, a plurality of machine learning models to simulate the performance of the education process to predict a performance outcome of a student based at least on information received by the plurality of students student identified by the one or more subsets of data, each machine learning model of the plurality of machine learning models translated into graphical representations: (i) representing a network of a respective subset of variables of the plurality of variables for simulating the performance of the education process, and (ii) illustrating for each variable of the plurality of variables a respective strength of predicting the performance of the education process;
- validate the plurality of machine learning models using the test data;
- simulate, using at least a subset of the plurality of machine learning models, a plurality of scenarios of the education process, simulating each scenario of the plurality of scenarios includes determining a respective performance metric of the education process;
- display a comparison of respective performance metrics of the education process for the plurality of scenarios; and
- provide a recommendation, based on the comparison, one or more action plans related to at least one stage of a plurality of stages of the education process.

* * * * *